(12) United States Patent
Wang

(10) Patent No.: US 12,199,132 B1
(45) Date of Patent: Jan. 14, 2025

(54) MANUFACTURING PROCESS FOR SEMICONDUCTOR OPTICAL DEVICE FOR LIDAR SENSOR SYSTEM

(71) Applicant: Aurora Operations, Inc., Pittsburgh, PA (US)

(72) Inventor: Lei Wang, Fremont, CA (US)

(73) Assignee: AURORA OPERATIONS, INC., Pittsburgh, PA (US)

( * ) Notice: Subject to any disclaimer, the term of this patent is extended or adjusted under 35 U.S.C. 154(b) by 0 days.

(21) Appl. No.: 18/658,422

(22) Filed: May 8, 2024

(51) Int. Cl.
| | |
|---|---|
| H01L 27/146 | (2006.01) |
| H01L 21/306 | (2006.01) |
| H01L 21/3065 | (2006.01) |
| H01L 21/3105 | (2006.01) |
| H01L 21/78 | (2006.01) |

(Continued)

(52) U.S. Cl.
CPC .. H01L 27/14687 (2013.01); H01L 21/30608 (2013.01); H01L 21/3065 (2013.01); H01L 21/31051 (2013.01); H01L 21/78 (2013.01); H01L 27/14627 (2013.01); H01L 27/14698 (2013.01); G01S 7/4811 (2013.01); G01S 17/931 (2020.01)

(58) Field of Classification Search
CPC ...... G02B 3/00; G02B 3/0006; G02B 3/0012; G02B 3/0018; G02B 3/0025; H01L 27/14687; H01L 21/30608; H01L 21/3065; H01L 21/31051; H01L 21/78; H01L 27/14627; H01L 27/14698; H01L 27/14625; H01L 27/14629; H01L 21/82; H01L 27/14685; H01L 31/0232; H01L 31/02327; G01S 17/931; G01S 7/4811; G01S 17/88; G01S 17/89; G01S 17/93; G01S 17/933; G01S 17/95
USPC ..... 359/355, 350, 351, 356; 356/3, 4.01, 51, 356/337, 338, 343; 216/2, 24, 26; 427/162; 438/29, 69
See application file for complete search history.

(56) References Cited

U.S. PATENT DOCUMENTS 6,049,430 A * 4/2000 Heanue ............ G11B 11/10543
8,884,347 B2 * 11/2014 Nihei ................ H01L 27/14623
257/E31.127

(Continued)

FOREIGN PATENT DOCUMENTS

WO  WO-2019033120 A1 * 2/2019 ......... H01S 5/04257

*Primary Examiner* — Arnel C Lavarias
(74) *Attorney, Agent, or Firm* — Dority & Manning, P.A.

(57) ABSTRACT

A method for manufacturing a semiconductor optical device for a LIDAR sensor system for a vehicle includes (a) forming a plurality of microlens structures at respective first locations on a first major surface of respective first and second semiconductor wafers. The method includes (b) forming a plurality of notch structures at respective second locations on a second major surface of the respective first and second semiconductor wafers, wherein the respective second locations on the second major surface are substantially opposite the respective first locations on the first major surface. The method includes (c) bonding the second major surface of the first semiconductor wafer to the second major surface of the second semiconductor wafer to form a semiconductor wafer pair. The method includes (d) dicing the semiconductor wafer pair to segment the semiconductor wafer pair into a plurality of individual semiconductor optical devices.

20 Claims, 12 Drawing Sheets

(51) Int. Cl.
  *G01S 7/481* (2006.01)
  *G01S 17/931* (2020.01)

(56) References Cited

U.S. PATENT DOCUMENTS

2008/0136955 A1* 6/2008 Kathman ............. G02B 6/4232
          257/E31.127
2013/0341747 A1* 12/2013 Lin ..................... H01L 31/0232
          257/432

\* cited by examiner

MANUFACTURING PROCESS FOR SEMICONDUCTOR OPTICAL DEVICE FOR LIDAR SENSOR SYSTEM

BACKGROUND

Light Detection and Ranging (LIDAR) systems use lasers to create three-dimensional representations of surrounding environments. A LIDAR system includes at least one emitter paired with a receiver to form a channel, though an array of channels may be used to expand the field of view of the LIDAR system. During operation, each channel emits a laser beam into the environment. The laser beam reflects off of an object within the surrounding environment, and the reflected laser beam is detected by the receiver. A single channel provides a single point of ranging information. Collectively, channels are combined to create a point cloud that corresponds to a three-dimensional representation of the surrounding environment.

The emitter and/or receiver often includes photonic circuitry formed on a semiconductor substrate such as a silicon die. Silicon photonics dies can provide for precise formation of the photonic circuitry through, for example, photolithography. Other optical components of a LIDAR sensor system may also be formed on semiconductor substrates, while still others are formed on or connected to components made using other semiconductor materials such as, for example, a group III-V semiconductor, gallium arsenide (GaAs), and/or other suitable materials.

SUMMARY

Aspects and advantages of implementations of the present disclosure will be set forth in part in the following description, or may be learned from the description, or may be learned through practice of the implementations.

The present application relates to methods of manufacturing semiconductor optical devices for LIDAR sensor systems. Such semiconductor optical devices can be manufactured at wafer level, thus providing advantageous improvements in total manufacturing time and cost for device production. Given the increasing prevalence of LIDAR sensor system use in object detection for vehicles, autonomous robots, and other platforms, improvements for manufacturing semiconductor optical devices at scale can greatly enhance overall system efficiencies.

An example method for manufacturing a semiconductor optical device for a LIDAR sensor system for a vehicle may include forming a plurality of microlens structures at respective first locations on a first major surface of respective first and second semiconductor wafers. The plurality of microlens structures may be formed at the respective first locations using a dry-etch process (e.g., reactive-ion etching). The manufacturing method may also include forming a plurality of notch structures at respective second locations on a second major surface of the respective first and second semiconductor wafers. The plurality of notch structures may be formed at the respective second locations using a wet-etch process (e.g., anisotropic Silicon etching). The respective second locations on the second major surface are substantially opposite the respective first locations on the first major surface. The method may also include bonding the second major surface of the first semiconductor wafer to the second major surface of the second semiconductor wafer to form a semiconductor wafer pair, which may then be diced to segment the semiconductor wafer pair into a plurality of individual semiconductor optical devices.

The present application also relates to semiconductor optical devices for LIDAR sensor systems. For example, a semiconductor optical device may be fabricated as an integrated optical structure having a first portion and a second portion. The first portion includes a first microlens structure configured to receive a first beam and a first notch structure coupled to the first microlens structure. The first notch structure is configured to receive the first beam and direct the first beam into an environment of a vehicle. The second portion includes a second notch structure configured to receive a second beam from the environment of the vehicle, and a second microlens structure coupled to the second notch structure. The second microlens structure is configured to receive the second beam reflected by the second notch structure and direct the second beam to a receiver.

Various reflective and anti-reflective coatings may be applied to surfaces of the semiconductor optical component to direct and/or block light as it travels through the device. By including such features to strategically direct light through the device, more light can be channeled into an environment of the LIDAR sensor system while avoiding back-reflection and potential interference with other system components. In addition, an integrated optical structure can reduce the total number of parts in the LIDAR sensor system, thus further reducing light loss and power reduction in overall system operation.

Some example aspects of the present disclosure are directed to LIDAR systems for autonomous vehicles. As further described herein, the LIDAR systems can be used by various devices and platforms (e.g., robotic platforms, etc.) to improve the ability of the devices and platforms to perceive their environment and perform functions in response thereto (e.g., autonomously navigating through the environment).

An autonomous vehicle (AV) can include a LIDAR system to assist the AV in perceiving its environment and navigating its environment. The LIDAR system can include a transceiver having a transmitter and receiver. The transmitter can condition a light beam (e.g., a laser beam) to be emitted by the LIDAR system into its environment. Similarly, the receiver can provide for receiving the light beam after it is emitted into the environment of the LIDAR system and reflected by objects in the environment. The receiver can provide the received beam to downstream components of the LIDAR system for processing, which can provide for the AV to perceive its environment. Because of the correlation between the transmitted beam and received beam, the transmitter and receiver may generally be placed in a tightly controlled positional relationship. For instance, the portion of the transmitter that emits the beam can be positioned near the portion of the receiver that receives the beam. In addition, some LIDAR systems such as coherent LIDAR systems can utilize a reference signal, such as a local oscillator (LO) signal, that passes from the transmitter to receiver without being emitted into the environment of the LIDAR system. For instance, this reference signal may be combined with the received beam to denoise or otherwise process the received beam to extract useful information. For instance, the LIDAR system can determine a distance to the object and/or velocity of the object based on the reflected beam.

One example aspect of the present disclosure is directed to a method for manufacturing a semiconductor optical device for a LIDAR sensor system for a vehicle. The method includes (a) forming a plurality of microlens structures at respective first locations on a first major surface of respective first and second semiconductor wafers. The method includes (b) forming a plurality of notch structures at respective second locations on a second major surface of the respective first and second semiconductor wafers, wherein the respective second locations on the second major surface are substantially opposite the respective first locations on the first major surface. The method includes (c) bonding the second major surface of the first semiconductor wafer to the second major surface of the second semiconductor wafer to form a semiconductor wafer pair. The method includes (d) dicing the semiconductor wafer pair to segment the semiconductor wafer pair into a plurality of individual semiconductor optical devices.

In some implementations, the plurality of individual semiconductor optical devices respectively include at least one of the plurality of microlens structures and at least one of the plurality of notch structures formed on the first semiconductor wafer and at least one of the plurality of microlens structures and at least one of the plurality of notch structures formed on the second semiconductor wafer.

In some implementations, (a) includes employing a dry-etch process to form the plurality of microlens structures at the respective first locations on the first major surface of the respective first and second semiconductor wafers.

In some implementations, (a) includes: (i) forming a pattern on the first major surface of the respective first and second semiconductor wafers, the pattern defining the respective first locations; (ii) depositing respective portions of lens material at the respective first locations; and (iii) heating the respective portions of lens material to shape the lens material into the plurality of microlens structures.

In some implementations, (i) includes employing a photolithography process to form the pattern on the first major surface of the respective first and second semiconductor wafers.

In some implementations, (b) includes employing a wet-etch process to form the plurality of notch structures at the respective second locations on the second major surface of the respective first and second semiconductor wafers.

In some implementations, (b) includes employing a wet-etch process to form the plurality of notch structures to respectively have a first angled surface and a second angled surface, wherein the first angled surface and the second angled surface are formed to have angles relative to the second major surface in a range of between about 20 degrees and about 70 degrees.

In some implementations, the method includes: (e) applying an anti-reflective coating to the first major surface of the respective first and second semiconductor wafers including the plurality of microlens structures.

In some implementations, the method includes: (f) applying a metal coating to the second major surface of the respective first and second semiconductor wafers including the plurality of notch structures.

In some implementations, (c) includes: (i) aligning a first notch structure of the first semiconductor wafer opposite a second notch structure of the second semiconductor wafer; and (ii) adhering together portions of the second major surface forming the respective first and second semiconductor wafers.

In some implementations, (d) includes: dicing the semiconductor wafer pair at a vertex of the first notch structure and at a vertex of the second notch structure.

In some implementations, the method includes: (g) smoothing an outer surface of the plurality of semiconductor optical devices, the outer surface configured for transmitting and receiving beams of the LIDAR sensor system.

In some implementations, the method includes: (h) applying an anti-reflective coating to the outer surface configured for transmitting and receiving beams of the LIDAR sensor system.

In some implementations, the method includes: (i) cutting the respective first and second semiconductor wafers from a semiconductor boule at a particular slicing angle such that the first major surface of the respective first and second semiconductor wafers is oriented in a range from about 5 to about 15 degrees relative to a (110) plane of a crystalline structure forming the semiconductor boule.

Another example aspect of the present disclosure is directed to a method for manufacturing a semiconductor optical device for a LIDAR sensor system for a vehicle. The method includes (a) employing a dry-etch process to form a plurality of microlens structures at respective first locations on a first major surface of respective first and second semiconductor wafers. The method includes (b) employing a wet-etch process to form a plurality of notch structures at respective second locations on a second major surface of the respective first and second semiconductor wafers, wherein the respective second locations on the second major surface are substantially opposite the respective first locations on the first major surface. The method includes (c) bonding the second major surface of the first semiconductor wafer to the second major surface of the second semiconductor wafer to form a semiconductor wafer pair. The method includes (d) dicing the semiconductor wafer pair to segment the semiconductor wafer pair into a plurality of individual semiconductor optical devices.

In some implementations, the method includes (e) applying an anti-reflective coating to the first major surface of the respective first and second semiconductor wafers including the plurality of microlens structures.

In some implementations, the method includes (f) applying a metal coating to the second major surface of the respective first and second semiconductor wafers including the plurality of notch structures.

In some implementations, (d) includes (g) dicing the semiconductor wafer pair at a vertex of a first notch structure of the plurality of notch structures formed on the first semiconductor wafer and at a vertex of a second notch structure of the plurality of notch structures formed on the second semiconductor wafer.

In some implementations, the method includes (h) smoothing an outer surface of the plurality of semiconductor optical devices, the outer surface configured for transmitting and receiving beams of the LIDAR sensor system.

In some implementations, the method includes (i) applying an anti-reflective coating to the outer surface configured for transmitting and receiving beams of the LIDAR sensor system.

Another example aspect of the present disclosure is directed to a semiconductor optical device for a LIDAR sensor system for a vehicle. The semiconductor optical device includes a first portion and a second portion bonded to the first portion. The first portion includes a first microlens structure configured to receive a first beam. The first portion also includes a first notch structure coupled to the first microlens structure, the first notch structure configured to receive the first beam and direct the first beam into an environment of the vehicle. The second portion includes a second notch structure surface configured to receive a second beam from the environment of the vehicle. The second portion also includes a second microlens structure coupled to the second notch structure, the second microlens structure configured to receive the second beam reflected by the second notch surface and direct the second beam to a receiver.

In some implementations, the first portion and the second portion respectively include silicon.

In some implementations, the first notch structure includes a first angled surface configured to receive the first beam from a first direction and reflect the first beam in a second direction into the environment of the vehicle.

In some implementations, the second notch structure includes a second angled surface configured to receive the second beam from a third direction and reflect the second beam in a fourth direction to the receiver.

In some implementations, the first direction is substantially parallel to the third direction, and the second direction is substantially parallel to the fourth direction.

In some implementations, the first angled surface and the second angled surface are positioned at opposing angles relative to one another and meet at a vertex between the first portion and the second portion.

In some implementations, the first angled surface and the second angled surface are formed at angles in a range of between about 20 degrees and about 70 degrees.

In some implementations, the semiconductor optical device also includes a metal coating applied between the first portion and the second portion.

In some implementations, the semiconductor optical device also includes an adhesive coating applied to the first portion and the second portion underneath the metal coating applied between the first portion and the second portion.

In some implementations, the semiconductor optical device also includes an anti-reflective coating applied to a surface of the first portion including the first microlens structure and applied to a surface of the second portion including the second microlens structure.

In some implementations, the anti-reflective coating is further applied to a polished outer surface of the semiconductor optical device configured for transmitting the first beam into the environment of the vehicle and for receiving the second beam from the environment.

Another example aspect of the present disclosure is directed to a light detection and ranging (LIDAR) sensor system for a vehicle. The LIDAR sensor system includes a light source configured to output a first beam. The LIDAR sensor system also includes a semiconductor optical device. The semiconductor optical device includes a first portion and a second portion bonded to the first portion. The first portion includes a first microlens structure configured to receive the first beam. The first portion also includes a first notch structure coupled to the first microlens structure, the first notch structure configured to receive the first beam and direct the first beam into an environment of the vehicle. The second portion includes a second notch structure configured to receive a second beam from the environment of the vehicle. The second portion also includes a second microlens structure coupled to the second notch structure, the second microlens structure configured to receive the second beam reflected by the second notch structure and direct the second beam to a receiver.

In some implementations, the first portion and the second portion respectively include silicon.

In some implementations, the first notch structure includes a first reflective surface configured to receive the first beam from a first direction and reflect the first beam in a second direction into the environment of the vehicle, and the second notch structure includes a second reflective surface configured to receive the second beam from a third direction and reflect the second beam in a fourth direction to the receiver.

In some implementations, the first direction is substantially parallel to the third direction, and the second direction is substantially parallel to the fourth direction.

In some implementations, the first reflective surface and the second reflective surface are positioned at opposing angles relative to one another and meet at a vertex between the first portion and the second portion.

In some implementations, the semiconductor optical device also includes a metal coating applied between the first portion and the second portion, and an adhesive coating applied to the first portion and the second portion underneath the metal coating applied between the first portion and the second portion.

In some implementations, the semiconductor optical device also includes an anti-reflective coating applied to a surface of the first portion including the first microlens structure and applied to a surface of the second portion including the second microlens structure.

In some implementations, the anti-reflective coating is further applied to a polished outer surface of the semiconductor optical device configured for transmitting the first beam into the environment of the vehicle and for receiving the second beam from the environment.

Another example aspect of the present disclosure is directed to an autonomous vehicle. The autonomous vehicle includes a light detection and ranging (LIDAR) system. The LIDAR system includes a light source configured to output a first beam. The LIDAR system also includes a semiconductor optical device. The semiconductor optical device includes a first portion and a second portion bonded to the first portion. The first portion includes a first microlens structure configured to receive the first beam. The first portion also includes a first notch structure coupled to the first microlens structure, the first notch structure configured to receive the first beam and direct the first beam into an environment of the vehicle. The second portion includes a second notch structure configured to receive a second beam from the environment of the vehicle. The second portion also includes a second microlens structure coupled to the second notch structure, the second microlens structure configured to receive the second beam reflected by the second notch structure and direct the second beam to a receiver.

Other example aspects of the present disclosure are directed to other systems, methods, vehicles, apparatuses, tangible non-transitory computer-readable media, and devices semiconductor device manufacturing for semiconductor optical devices in a LIDAR system having a LIDAR module according to example aspects of the present disclosure.

These and other features, aspects and advantages of various implementations of the present disclosure will become better understood with reference to the following description and appended claims. The accompanying drawings, which are incorporated in and constitute a part of this specification, illustrate implementations of the present disclosure and, together with the description, serve to explain the related principles.

DETAILED DESCRIPTION

The following describes the technology of this disclosure within the context of an autonomous vehicle for example purposes only. As described herein, the technology is not limited to an autonomous vehicle and can be implemented within other robotic and computing systems as well as various devices. For example, the systems and methods disclosed herein can be implemented in a variety of ways including, but not limited to, a computer-implemented method, an autonomous vehicle system, an autonomous vehicle control system, a robotic platform system, a general robotic device control system, a computing device, etc.

Figure 1A:
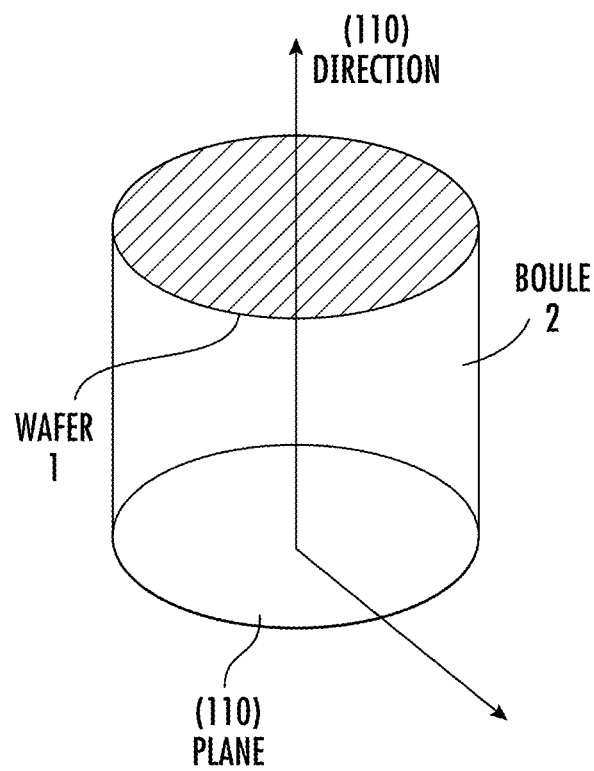
FIG. 1A is a perspective view of an exemplary semiconductor wafer relative to a semiconductor boule showing crystallographic orientation directions.

With reference to FIGS. 1A-10, example implementations of the present disclosure are discussed in further detail. FIG. 1A is a perspective view of an exemplary semiconductor wafer 1 relative to a semiconductor boule 2 from which semiconductor wafers for use in the disclosed semiconductor optical devices and related manufacturing methods may be sliced. FIG. 1B is a simplified cross-sectional view of the semiconductor wafer 1 of FIG. 1A superimposed over a portion of a semiconductor boule 2.

Semiconductor wafer 1 and semiconductor boule 2 may correspond to various crystalline materials such as, but not limited to, silicon. In certain embodiments, single crystal silicon and polycrystalline silicon varieties may be utilized. Intentionally or unintentionally doped silicon may be utilized to form semiconductor boule 2 and semiconductor wafer 1. In addition, silicon or other crystalline materials used to form semiconductor boule 2 and semiconductor wafer 1 may have various on-axis and off-axis crystallographic orientations. Although semiconductor wafer 1 is shown as a generally circular wafer cut from a generally cylindrical semiconductor boule, it should be appreciated that wafers may be cut from different boules such as those shaped as a cube, rectangular prism, hexagonal cylinder, or other three-dimensional shapes.

As known to those of ordinary skill in art, the crystalline growth structure of silicon may generally be referenced with respect to crystallographic orientation directions. For example, the [100], [110], and directions are crystallographic directions in a crystal lattice of a silicon wafer, while the (100), (110), and (111) planes are corresponding planes associated with such directions. The set of three integers used to define the orientation of the respective crystallographic planes and directions correspond to Miller indices, which are indicative of respective intercepts of the plane or direction on the axes for a given combination. For example, in a silicon wafer, the (100) plane is a crystal plane that is perpendicular to the direction, which is a line parallel to the y-axis of the crystal lattice. The (110) plane is a crystal plane that is perpendicular to the direction, which is a line at a 45-degree angle to the x- and y-axes of the crystal lattice. The (111) plane is a crystal plane that is perpendicular to the direction, which is a line at a 54.7-degree angle to the x-, y-, and z-axes of the crystal lattice.

Figure 1B:
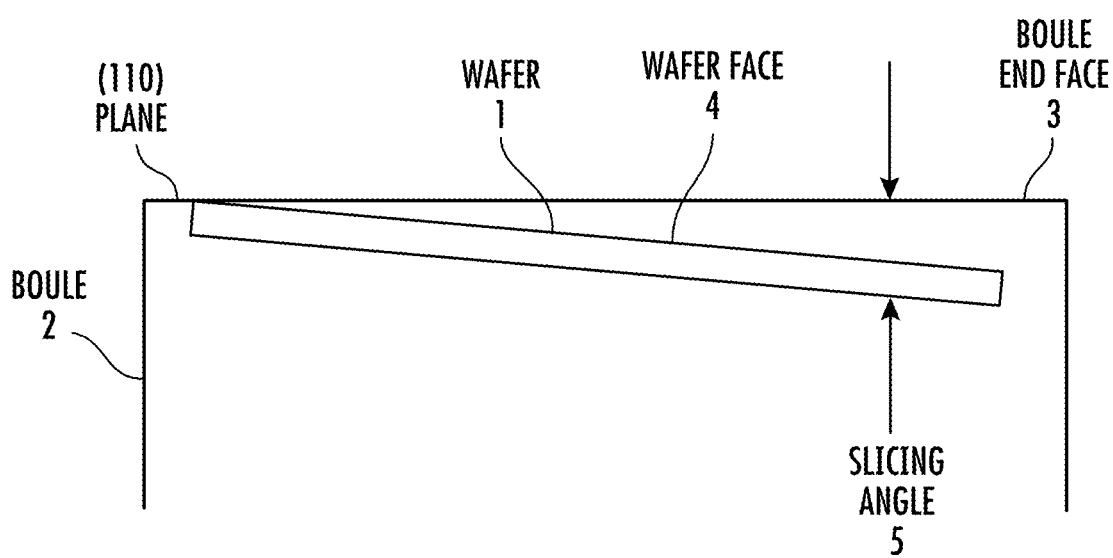
FIG. 1B is a simplified cross-sectional view of the semiconductor wafer of FIG. 1A superimposed over a portion of a semiconductor boule.

Referring still to FIGS. 1A and 1B, semiconductor boule 2 is considered to have a particular orientation such that the boule end face 3 is oriented along the (110) plane within the crystal lattice structure of the silicon boule 2. Semiconductor wafers cut parallel to the boule end face 3 would correspond to (110) semiconductor wafers. In some embodiments of the disclosed technology, (110) silicon wafers cut from semiconductor boule 2 in such fashion may be employed. In other embodiments, a semiconductor wafer 1 is cut from semiconductor boule 2 at a particular slicing angle 5. The slicing angle 5 may be chosen in a manner to facilitate formation of notch structures within the semiconductor wafer 1 as described herein. In some implementations, the slicing angle is chosen in a range from about 5 to about 15 degrees, or about 10 degrees, or about 9.7 degrees relative to the (110) plane of the crystalline structure forming semiconductor boule 2. In other words, the wafer face 4 of semiconductor wafer 1 is rotated relative to the boule end face 3 of the semiconductor boule 2 by slicing angle 5.

FIGS. 2A-2I respectively depict aspects of semiconductor wafer fabrication in a manufacturing process for semiconductor optical devices according to some implementations of the present disclosure. FIGS. 2A-2I depict only part of a two-dimensional segment of a semiconductor wafer and associated structures fabricated thereon. It should be appreciated that a greater or fewer number of structures (e.g., microlens structures, notch structures, etc.) may be formed on a semiconductor wafer in multiple dimensions (e.g., first and second dimensions) on a surface of the depicted semiconductor wafers.

Figure 2A:
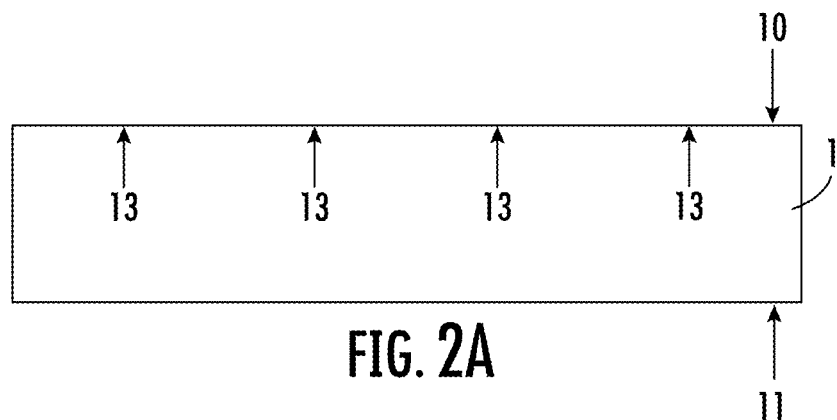
FIGS. 2A-2I respectively depict aspects of semiconductor wafer fabrication in a manufacturing process for semiconductor optical devices according to some implementations of the present disclosure.

Referring first to FIG. 2A, a semiconductor wafer 1 may be provided as part of the disclosed manufacturing process. In some examples, the semiconductor wafer 1 depicted in FIG. 2A may be the same as semiconductor wafer 1 depicted in FIGS. 1A and 1B. In one example, semiconductor wafer 1 of FIG. 2A may include silicon. Semiconductor wafer 1 of FIG. 2A may include a first major surface 10 and a second major surface 11 opposing the first major surface 10. First major surface 10 and second major surface 11 may be substantially parallel (e.g., ±5 degrees of one another). As also described relative to FIGS. 1A-1B, first major surface 10 and second major surface 11 may be cut from a semiconductor boule (e.g., semiconductor boule 2) at a particular slicing angle such that the first major surface 10 and/or the second major surface 11 of the semiconductor wafer 1 is oriented in a range from about 5 to about 15 degrees (e.g., about 10 degrees or about 9.7 degrees) relative to the (110) plane of the crystalline structure forming the semiconductor boule.

Figure 2B:
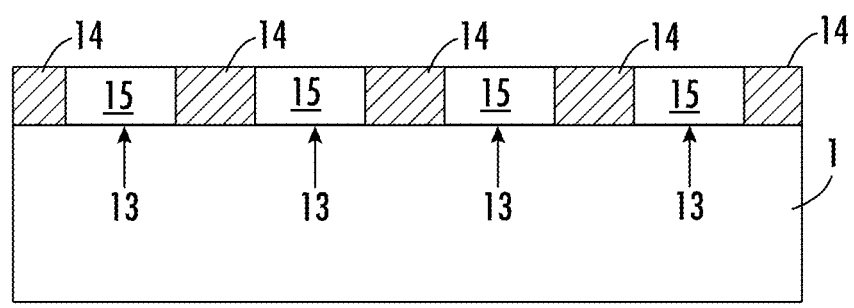
Figure 2C:
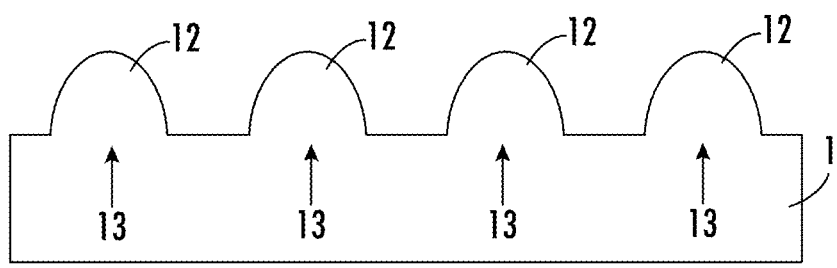

Referring now to FIGS. 2B-2C, a plurality of microlens structures 12 may be formed at respective first locations 13 on the first major surface 10 of the semiconductor wafer 1. In some examples, the respective first locations 13 and corresponding microlens structures 12 may be fabricated in a single linear arrangement (e.g., a one-dimensional array). In other examples, the respective first locations 13 and corresponding microlens structures 12 may be fabricated in a plurality of linear arrangements (e.g., a two-dimensional array) on the first major surface 10 of the semiconductor wafer 1.

In some examples, the plurality of microlens structures 12 may be formed at the respective first locations 13 using a dry-etch process (e.g., reactive-ion etching). For instance, a pattern 14 may be formed on the first major surface 10 of the semiconductor wafer 1. The pattern 14 may be formed to define a plurality of generally circular or rounded openings corresponding to the respective first locations 13. In some examples, a photolithography process may be employed to form the pattern 14 on the first major surface 10 of the semiconductor wafer 1. For example, a photosensitive material (e.g., a photoresist) may be applied to the first major surface 10 of the semiconductor wafer 1. A photomask formed to define the pattern 14 may then be placed over the photosensitive material. Light may be provided from a light source (e.g., an ultraviolet (UV) light source, deep UV light source, extreme UV light source, X-ray light source, etc.) When light is provided to the photomask, the photosensitive material is exposed in certain areas, causing the exposed areas to undergo a chemical change, making them either soluble or insoluble in a development solution. After development, the pattern 14 is transferred onto the first major surface 10 of the semiconductor wafer 1 through one or more processes, such as etching, chemical vapor deposition, or an ion implantation process.

Referring still to FIGS. 2B-2C, respective portions of lens material 15 may be deposited at the respective first locations 13 now defined by the pattern 14. In some examples, lens material 15 may include one or more of a polymer material, polypropylene, polystyrene, acrylic resin (PMMA), polycarbonate (PC), polyetherimide (PEI), cyclo-olefin polymer (COP), cyclo-olefin co-polymer (COC), methyl pentene, acrylonitrile butadiene styrene (ABS), ophthalmic material, glass material, thermoplastic material, or other suitable material. Lens material 15 may be deposited in generally cylindrical portions at the respective first locations 13 defined by the pattern 14. The respective portions of lens material 15 are then heated to shape the lens material 15 into the plurality of microlens structures 12. For example, the heat can cause the lens material 15 to swell and transform into respective dome-shaped structures or hemispherical structures corresponding to the respective microlens structures 12. After this, the wafer assembly of FIG. 2B may be subjected to a reactive-ion etching (RIE) process, such as a process that exposes the wafer assembly to a chemically reactive plasma in a wafer processing chamber to remove the pattern 14. Plasma may be generated, for example, in the wafer processing chamber under low pressure by an electromagnetic field. High-energy ions from the plasma attack the first major surface 10 and react with it to remove pattern 14.

Figure 2D:
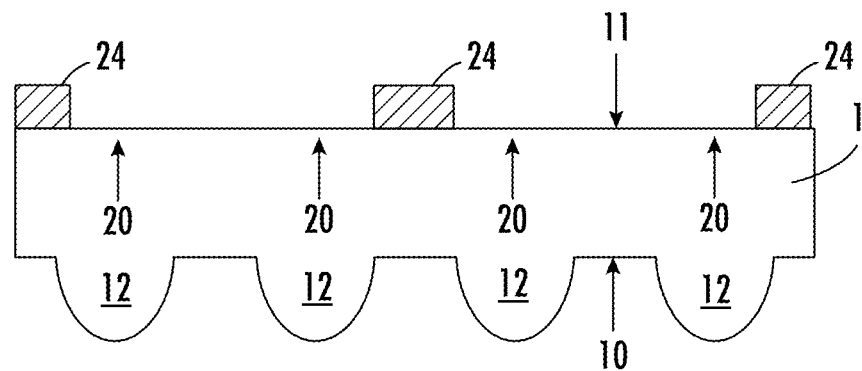
Figure 2E:
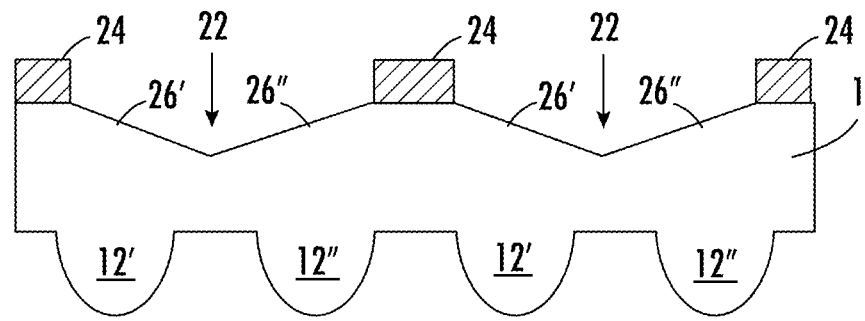
Figure 2F:
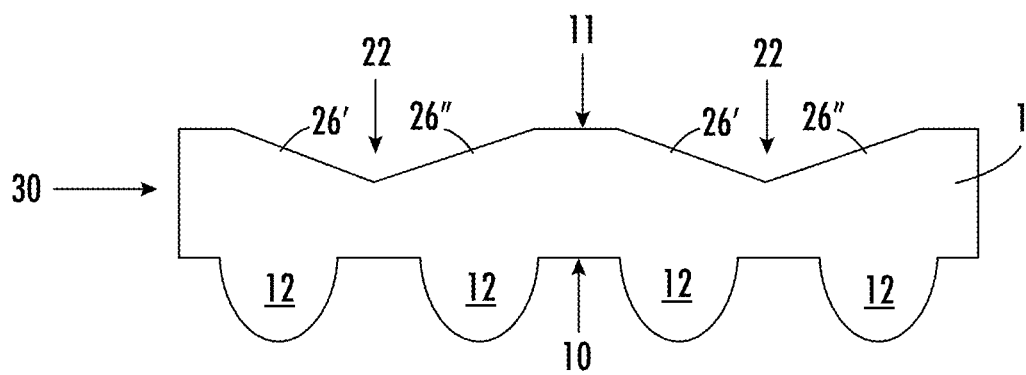

Referring now to FIGS. 2D-2F, the disclosed manufacturing process may further involve forming a plurality of notch structures 22 at respective second locations 20 on the second major surface 11 of the semiconductor wafer 1. The respective second locations 20 on the second major surface 11 may be substantially opposite (e.g., within about 1-20 microns of a common axis through the first major surface 10 and the second major surface 11 of the semiconductor wafer 1) the respective first locations 13 on the first major surface 10. The notch structures 22 can include angled surfaces 26 formed as a V-groove between pattern 24 in the second major surface 11. In some embodiments, such as depicted in FIGS. 2D-2E, each notch structure 22 includes a first angled surface 26' and a second angled surface 26". The first angled surface 26' and the second angled surface 26" are formed to have angles relative to the second major surface 11 in a range of between about 40 degrees and about 50 degrees (e.g., about 45 degrees), between about 30 degrees and about 60 degrees, or between about 20 degrees and about 70 degrees. Respective first angled surfaces 26' on the second major surface 11 may be substantially opposite a respective first microlens structures 12' on the first major surface, while respective second angled surfaces 26" on the second major surface 11 may be substantially opposite respective second microlens structures 26" on the second major surface 11.

In some implementations, the plurality of notch structures 22 including first angled surfaces 26' and second angled surfaces 26" may be formed at the respective second locations 20 using a wet-etch process (e.g., anisotropic Silicon etching). For instance, a pattern 24 may be formed on the second major surface 11 of the semiconductor wafer 1. The pattern 24 may be formed to define a plurality of openings corresponding to the respective second locations 20. In some examples, a photolithography process may be employed to form the pattern 24 on the second major surface 11 of the semiconductor wafer 1. For example, a photosensitive material (e.g., a photoresist) may be applied to the second major surface 11 of the semiconductor wafer 1. A photomask formed to define the pattern 24 may then be placed over the photosensitive material. Light may be provided from a light source (e.g., an ultraviolet (UV) light source, deep UV light source, extreme UV light source, X-ray light source, etc.) When light is provided to the photomask, the photosensitive material is exposed in certain areas, causing the exposed areas to undergo a chemical change, making them either soluble or insoluble in a development solution. After development, the pattern 24 is transferred onto the second major surface 11 of the semiconductor wafer 1 through one or more processes, such as etching, chemical vapor deposition, or an ion implantation process. In some embodiments (although not illustrated), the pattern 24 is also formed along the entirety of the first major surface 10 including the microlens structures 12 to protect them during the wet-etch process of forming notch structures 22.

Referring still to FIGS. 2D-2F, a wet-etch process may then be employed to selectively remove material from the semiconductor wafer 1 at exposed locations among pattern 24 on the second major surface 11. For example, the semiconductor wafer 1 including pattern 24 may be exposed to an etching solution that selectively removes material from the semiconductor wafer. The semiconductor material removal may cause material removal in planar directions, creating well-defined features with sharp corners and edges, such as the first angled surface 26' and second angled surface 26" of notch structures 22. When semiconductor wafer 1 includes a silicon wafer, an anisotropic etching solution may be used such as a solution that contains one or more of: potassium hydroxide (KOH), tetramethylammonium hydroxide (TMAH), nitric acid and hydrofluoric acid (HNO3/HF), etc. An anisotropic etching solution may remove material from the (111) planes of the silicon wafer, creating features corresponding to the notch structure 22. Pattern 24 may also be removed to form a semiconductor wafer 30 as depicted in FIG. 2F.

Figure 2G:
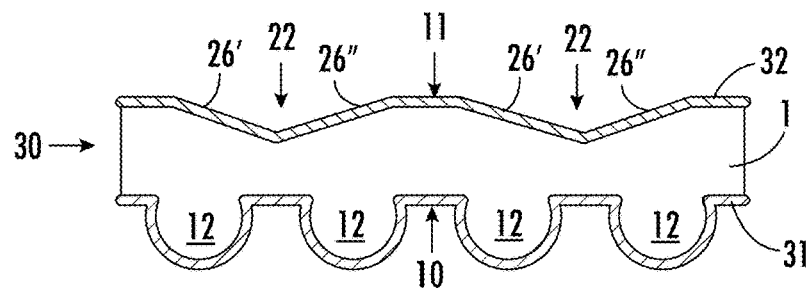
Figure 2H:
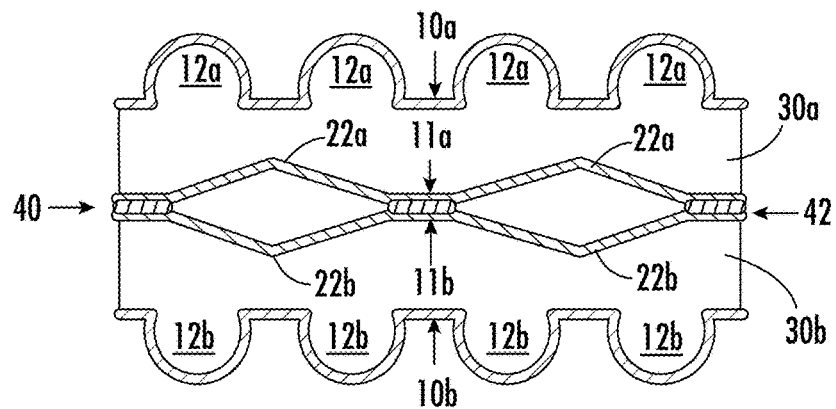
Figure 2I:
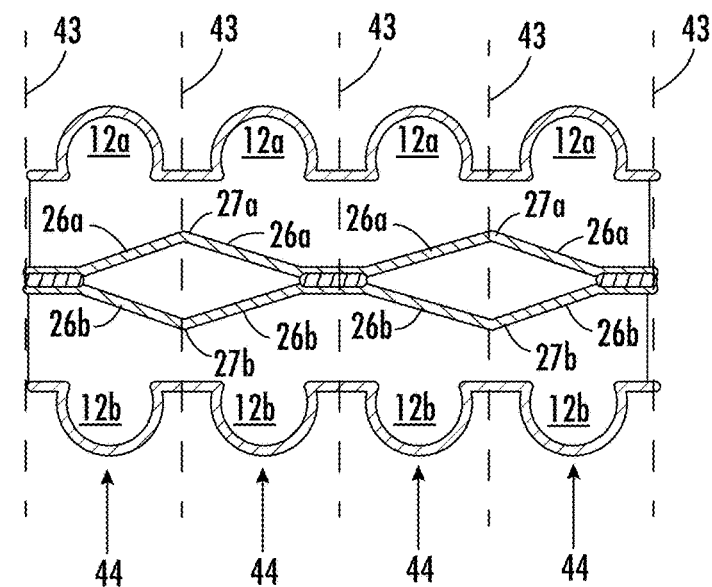

Referring now to FIGS. 2G-2I, the disclosed manufacturing process may further involve additional steps to transform multiple semiconductor wafers 30 into a plurality of individual semiconductor optical devices. For instance, as shown in FIG. 2G, one or more coatings may be applied to one or more surfaces of the semiconductor wafer 30. For example, an anti-reflective coating 31 may be applied to the first major surface 10 of the semiconductor wafer 30 including the plurality of microlens structures 12. The anti-reflective coating 31 may include magnesium fluoride, silicon dioxide, dielectric coatings, and the like. Additionally or alternatively, a metal coating 32 may be applied to the second major surface 11 of the semiconductor wafer 30 including the plurality of notch structures 22 such that respective first angled surfaces 26' and 26" have metal coating 32 thereon to facilitate function as a turning mirror as later described herein. In some implementations, an adhesive coating (e.g., silicon oxide, silicon nitride, a dielectric coating, etc.) is first applied to the angled surfaces 26', 26" underneath the metal coating 32 (e.g., aluminum, chromium, anodized chromium or black chrome, etc.) to facilitate adhesion of the metal coating 32 to the silicon or other material forming semiconductor wafer 30.

Referring now to FIG. 2H, a first semiconductor wafer 30a and a second semiconductor wafer 30b may be adhered together to form a semiconductor wafer pair 40. More particularly, a second major surface 11a of the first semiconductor wafer 30a may be adhered to a second major surface 11b of the second semiconductor wafer 30b with a bonding layer 42. The first and second semiconductor wafers 30a and 30b may be aligned by aligning one or more opposing features. For instance, first notch structures 22a of the first semiconductor wafer 30a may be aligned substantially opposite second notch structures 22b of the second semiconductor wafer 30b. Additionally or alternatively, first microlens structures 12a of the first semiconductor wafer 30a may be aligned substantially opposite second microlens structures 12b of the second semiconductor wafer 30b. Additionally or alternatively, portions of the second major surface 11a of the first semiconductor wafer 30a between respective first notch structures 22a may be aligned substantially opposite portions of the second major surface 11b of the second semiconductor wafer 30b between respective first notch structures 22b. These opposing portions of the second major surfaces 11a and 11b may be adhered together with a bonding layer 42.

Referring now to FIG. 2I, the semiconductor wafer pair 40 of FIG. 2H may be diced along dicing lines 43 to form a plurality of individual semiconductor optical devices 44. In some examples, dicing along a dicing line 43 may correspond to dicing the first semiconductor wafer 30a at a first vertex 27a of a first notch structure 22a and the second semiconductor wafer 30b at a second vertex 27b of a second notch structure 22b. Prior to dicing, in some implementations, individual semiconductor optical devices 44 can be isolated from one another by one or more respective deep ridge etches (not illustrated) formed on the first major surfaces 10 of the respective semiconductor wafers 30. Such deep ridge etches may be formed, for example, using the same or similar dry etch process used to form the respective microlens structures 12. For example, a plurality of deep ridge etches may be formed on the first major surface 10a of the first semiconductor wafer 30a such that a respective deep ridge etch is formed between adjacent microlens structures 12a. Similarly, a plurality of deep ridge etches may be formed on the first major surface 10b of the second semiconductor wafer 30b such that a respective deep ridge etch is formed between adjacent microlens structures 12b. The semiconductor wafer pair 40 may then be diced along respective deep ridge etches to form a plurality of individual semiconductor optical devices 44.

In some examples, after dicing along dicing lines 43 as indicated in FIG. 2H, additional operations may be applied to the individual semiconductor optical devices 44. For example, an outer surface of the individual semiconductor optical devices 44 where diced (e.g., at the dicing lines 43) may be smoothed (e.g., by grinding, polishing, lapping, etc.). Smoothing of such surfaces can help to facilitate directing beams (e.g., transmitting and/or receiving beams) in and/or out of the semiconductor optical devices 44. Additionally or alternatively, an anti-reflective coating may be applied to the outer surface of the individual semiconductor optical devices 44 where diced and optionally smoothed at the dicing lines 43.

Figure 3:
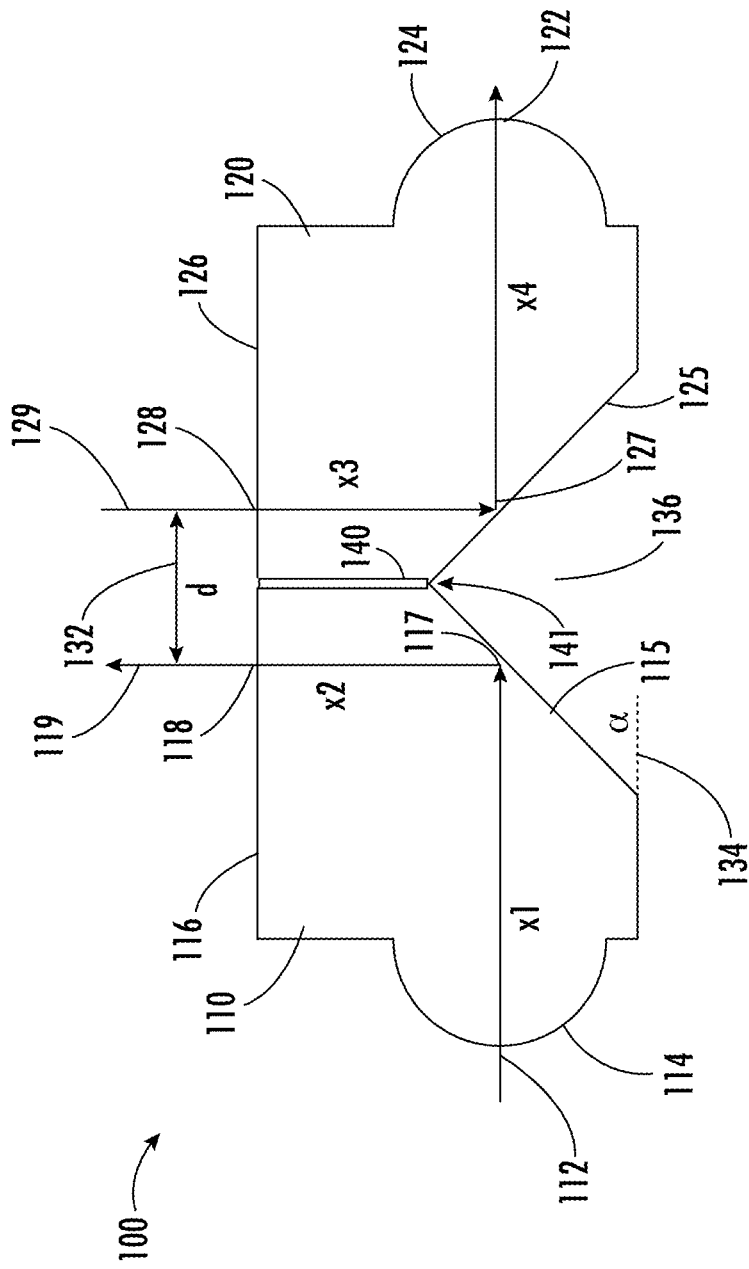
FIG. 3 depicts a semiconductor optical device according to some implementations of the present disclosure.

FIG. 3 depicts a semiconductor optical device 100, according to some implementations of the disclosure. The semiconductor optical device 100 can be fabricated using the manufacturing operations described herein, and may correspond for example, to the semiconductor optical devices 44 formed in FIG. 2H. Semiconductor optical device 100 can be included in a LIDAR system, such as the LIDAR system 150 of FIG. 4, the LIDAR system 200 of FIG. 5 (e.g., as part of the transceiver 230), and the like.

In FIG. 3, the semiconductor optical device 100 may include two portions, for example a first portion 110 and a second portion 120. The first portion 110 and the second portion 120 may be respectively fabricated using a semiconductor material, such as silicon, glass, polymer, doped plastic, or other suitable material. In some implementations, the first portion 110 and the second portion 120 may be combined or integrated together as a single device. For example, the first portion 110 and the second portion 120 may be joined together via a metal coating 140 or other bonding layer. The metal coating 140 may be configured or formed of a material to prevent an outgoing light 119 from mixing with an incoming light 129. In some implementations, the semiconductor optical device 100 may include two bonded monolithic silicon microlens arrays (e.g., corresponding to the first portion 110 and the second portion 120, respectively) that each have integrated turning mirrors. For example, the semiconductor optical device 100 can include respective portions from the first and second semiconductor wafers 30a and 30b of FIG. 2H.

The first portion 110 includes a first microlens structure 114, a first angled surface 115, and a first beam directing portion 116. The outgoing light 119 may enter the first microlens structure 114 at a first location 112 and be reflected by the first angled surface 115 (which acts as a mirror) at a second location 117, and then be transmitted out of the first beam directing portion 116 at a third location 118 to an environment (e.g., toward an object). The outgoing light 119 may reflect off an object in the environment and be reflected back toward the semiconductor optical device 100. The light which is reflected off the object and back toward the semiconductor optical device 100 may correspond to the incoming light 129.

The second portion 120 includes a second microlens structure 124, a second angled surface 125, and a second beam directing portion 126. The incoming light 129 may enter the second beam directing portion 126 at a fourth location 128 and be reflected by the second angled surface 125 (which acts as a mirror) at a fifth location 127, and then be transmitted out of the second microlens structure 124 at a sixth location 122 to an environment (e.g., toward a receiver such as receiver 168 in FIG. 4).

The first microlens structure 114 may include an integrated optical lens that is configured to direct (e.g., collimate) the outgoing light 119 that is transmitted along a first direction x1 and enters at the first location 112 and focuses the outgoing light 119 onto the first angled surface 115 where it is reflected in a second direction x2 toward the first beam directing portion 116. For example, the first microlens structure 114 may include a spherical lens, a cylindrical lens, an elliptical lens, and the like. In some implementations, the first microlens structure 114 may be formed of a silicon material, a polymer plastic material, etc. In some implementations, the first microlens structure 114 may include an anti-reflective coating which is configured or formed to minimize reflection and increase light transmission through the first microlens structure 114. The anti-reflective coating may include magnesium fluoride, silicon dioxide, dielectric coatings, and the like. The anti-reflective coating on first microlens structure 114 may correspond, for example, to the anti-reflective coating 31 depicted in FIG. 2G.

The second location 117 of the first angled surface 115 may be configured to receive the outgoing light 119 which is transmitted along the first direction x1 and direct the outgoing light 119 in the second direction x2 toward the third location 118 of the first beam directing portion 116. In some implementations, the first direction x1 and the second direction x2 may be perpendicular to one another, or substantially perpendicular (e.g., ±10 degrees). In some implementations, the first angled surface 115 may be configured to redirect or reflect the outgoing light 119 by internal reflection. In some implementations, the first angled surface 115 may include or be formed of a material which is configured to redirect or reflect the outgoing light 119. For example, a metal layer may be provided at an outer side of the first angled surface 115 such that the first angled surface 115 is configured to function as a mirror. For example, an anti-reflective layer may be provided at an outer side of the first angled surface 115. For example, the first angled surface 115 may be configured to be angled with respect to the first direction x1 by a predetermined angle α 134. In some implementations, the predetermined angle α 134 may be about 45 degrees. In some implementations, the predetermined angle α 134 may be between about 40 degrees and about 50 degrees, between about 30 degrees and about 60 degrees, or between about 20 degrees and about 70 degrees.

The first beam directing portion 116 may be configured to receive the outgoing light 119 which is transmitted along the second direction x2 to the third location 118 and direct the outgoing light 119 in the second direction x2 toward an environment (e.g., toward an object in the environment, toward a sensor, etc.). In some implementations, the first beam directing portion 116 may be formed of a silicon material, a polymer plastic material, etc. In some implementations, the first beam directing portion 116 may include an anti-reflective coating which is configured or formed to minimize reflection and increase light transmission through the first beam directing portion 116. The anti-reflective coating may include magnesium fluoride, silicon dioxide, dielectric coatings, and the like. The anti-reflective coating applied to the first beam directing portion 116 may be applied to such associated surface of the semiconductor optical device 100 after dicing as described in FIG. 2I and surface smoothing (e.g., by grinding, polishing, lapping, etc.)

As mentioned above, the outgoing light 119 may reflect off an object in the environment and be reflected back toward the semiconductor optical device 100. The light which is reflected off the object and back toward the semiconductor optical device 100 may correspond to the incoming light 129. For example, the second beam directing portion 126 may be configured to receive the incoming light 129 which is transmitted along a third direction x3 at a fourth location 128 and direct the incoming light 129 in the third direction x3 toward a fifth location 127 at the second angled surface 125. In some implementations, the fourth location 128 and third location 118 may be separated from each other by a distance d 132. In some implementations, the outgoing light 119 and the incoming light 129 may be separated from each other by the distance d 132. For example, the distance d 132 may be about 100 μm, for example, about 80 μm to about 120 μm. In some implementations, the outgoing light 119 and the incoming light 129 may be parallel to one another or substantially parallel to one another (e.g., within ±5 degrees, ±10 degrees, etc.).

In some implementations, the second beam directing portion 126 may be formed of a silicon material, a polymer plastic material, etc. In some implementations, the second beam directing portion 126 may include an anti-reflective coating which is configured or formed to minimize reflection and increase light transmission through the second beam directing portion 126. The anti-reflective coating may include magnesium fluoride, silicon dioxide, dielectric coatings, and the like. The anti-reflective coating applied to the second beam directing portion 126 may be applied to such associated surface of the semiconductor optical device 100 at the same time as applying the anti-reflective coating to the first beam direction portion 116, namely, after dicing as described in FIG. 2I and surface smoothing (e.g., by grinding, polishing, lapping, etc.)

For example, the fifth location 127 at the second angled surface 125 may be configured to receive the incoming light 129 which is transmitted along the third direction x3 and direct the incoming light 129 in the second direction x2 toward a sixth location 122 at the second microlens structure 124. In some implementations, the first direction x1 and the third direction x3 may be perpendicular to one another, or substantially perpendicular (e.g., ±10 degrees). In some implementations, the second angled surface 125 may be configured to redirect or reflect the incoming light 129 by internal reflection. In some implementations, the second angled surface 125 may include or be formed of a material which is configured to redirect or reflect the incoming light 129. For example, the first portion 110 (e.g., the first angled surface 115 which acts as a first mirror) and the second portion 120 (e.g., the second angled surface 125 which acts as a second mirror) may be joined together at a location which forms a notch and corresponds to the metal coating 140, particularly where the first and second mirrors (e.g., the first angled surface 115 and the second angled surface 125) intersect. In other words, the first angled surface 115 and the second angled surface 125 may be positioned at opposing angles relative to one another and meet at a vertex 141 between the first portion 110 and the second portion 120.

For example, a metal layer may be provided at an outer side of the second angled surface 125 such that the second angled surface 125 is configured to function as a mirror. The interior portion 136 formed between the first angled surface 115 and the second angled surface 125 may be hollow and/or composed of air. For example, an anti-reflective layer may be provided at an outer side of the second angled surface 125. For example, the second angled surface 125 may be configured to be angled with respect to the first direction x1 by a predetermined angle α 134. In some implementations, the predetermined angle α 134 may be between about 40 degrees and about 50 degrees, between about 30 degrees and about 60 degrees, or between about 20 degrees and about 70 degrees.

Figure 4:
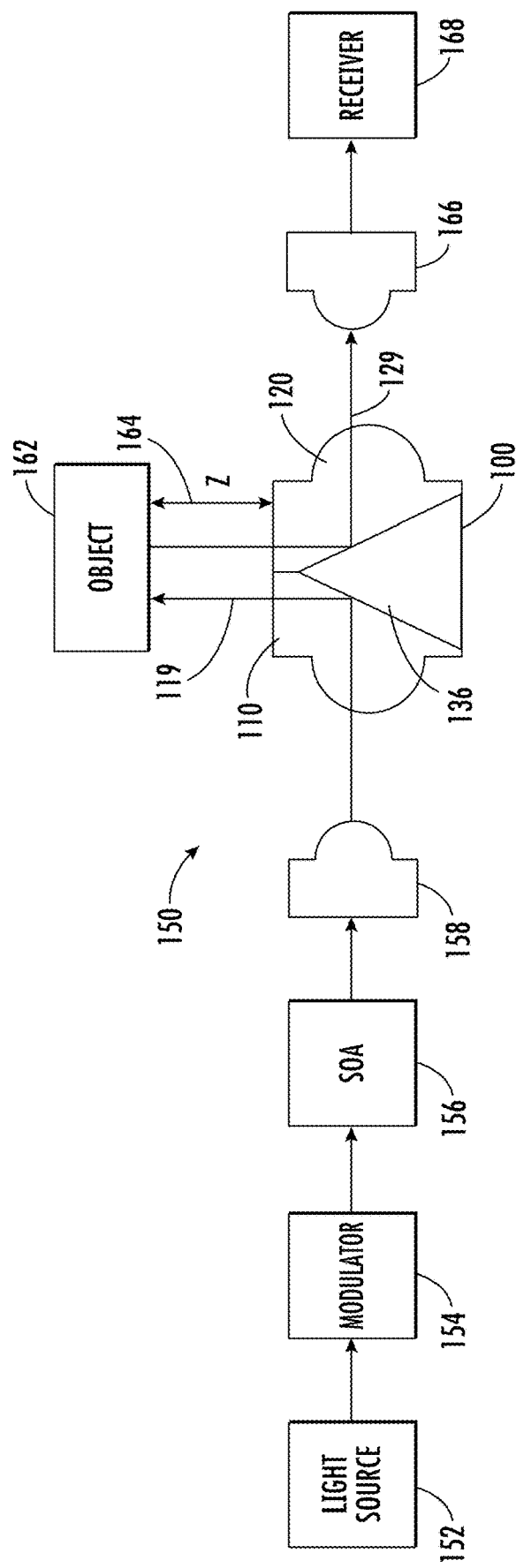
FIG. 4 depicts a block diagram of an example LIDAR system according to some implementations of the present disclosure.

The second microlens structure 124 may include an optical lens that is configured to direct (e.g., collimate) the incoming light 129 that is transmitted along the first direction x1 from the second angled surface 125 and exits at the sixth location 122 to be transmitted toward an environment (e.g., toward a receiver such as receiver 168 in FIG. 4). For example, the second microlens structure 124 may include a spherical lens, a cylindrical lens, an elliptical lens, and the like. In some implementations, the second microlens structure 124 may be formed of a silicon material, a polymer plastic material, etc. In some implementations, the second microlens structure 124 may include an anti-reflective coating which is configured or formed to minimize reflection and increase light transmission through the second microlens structure 124. The anti-reflective coating may include magnesium fluoride, silicon dioxide, dielectric coatings, and the like.

FIG. 4 depicts a block diagram of a LIDAR system 150, according to some implementations of the disclosure. The semiconductor optical device 100 of FIG. 3 can be included in the LIDAR system 150 of FIG. 4. The LIDAR system 150 can also include one or more of a light source 152, a modulator 154, one or more semiconductor optical amplifiers (SOAs) 156, a first optical component 158, the semiconductor optical device 100, a second optical component 166, and a receiver 168.

The light source 152 can be configured to provide a light beam (e.g., a laser beam). The light source 152 can provide the light beam to the modulator 154 (e.g., a phase modulator). In some implementations, the light beam can be split among a plurality of channels (e.g., a plurality of transmit channels) that each carry a portion of the beam from the light source 152. For instance, each transmit channel may correspond to a respective transmit output to provide a portion of the light beam to a respective portion of the environment of the LIDAR system 150 such that the LIDAR system 150 can scan multiple proximate points simultaneously. In some implementations, a local oscillator (LO) signal may also be output from the light source 152 (e.g., in a manner similar to that shown in FIG. 5). The LO signal may be equivalent to the signal from the light source 152 or may be modulated from the signal from the light source 152 (e.g., by an LO modulator such as modulator 204B of FIG. 5).

The modulator 154 can be configured to modulate the light beam output by the light source 152 to modify a phase and/or a frequency of the light beam. In some embodiments, the modulator 154 can be a silicon phase modulator. The modulator 154 can modulate the light beam by, for example, using Continuous Wave (CW) modulation or quasi-CW modulation. In some implementations, the modulator 154 can be disposed on a transmit die or another suitable substrate.

The LIDAR system 150 can include one or more amplifiers configured to receive the light beam from the light source 152 (e.g., via the modulator 154) and amplify the light beam. The amplifiers may include, for example, the one or more semiconductor optical amplifiers (SOAs) 156.

The first optical component 158 may be configured to receive the light beam emitted by the light source 152 (e.g., via the modulator 154 and the one or more SOAs 156). The first optical component 158 may include a lens, for example a collimating lens or a micro lens array. In some implementations the first optical component 158 can include one or more optic components including an oscillatory scanner, a unidirectional scanner, a Risley prism, a circulator optic, and/or a beam collimator, etc.

The semiconductor optical device 100 may be configured to receive the light beam output by the first optical component 158 and transmit the light beam (e.g., the outgoing light 119) to an environment of the LIDAR system 150 (e.g., to the object 162). Aspects of the semiconductor optical device 100 have been described with respect to FIG. 3, and therefore a detailed discussion of the operations and features of the semiconductor optical device 100 will be omitted for the sake of brevity. The semiconductor optical device 100 may be configured to receive the light beam reflected back from the object 162 in the environment and transmit the reflected light beam (e.g., the incoming light 129) to the second optical component 166.

The second optical component 166 may be configured to receive the reflected light beam (e.g., the incoming light 129) from the environment (e.g., via the semiconductor optical device 100). The second optical component 166 may include a lens, for example a collimating lens or a micro lens array. In some implementations the second optical component 166 can include one or more optic components including an oscillatory scanner, a unidirectional scanner, a Risley prism, a circulator optic, and/or a beam collimator, etc. The second optical component 166 may be configured to direct the reflected light beam (e.g., the incoming light 129) toward the receiver 168.

The receiver 168 may be configured to receive the reflected light beam (e.g., the incoming light 129) from the environment (e.g., via the semiconductor optical device 100 and the second optical component 166). In some implementations, the reflected light beam can be provided among a plurality of receive channels, where each receive channel captures a portion of transmitted light from a respective transmit channel (e.g., the outgoing light 119) after being reflected by a corresponding point in the environment (e.g., the object 162). In addition to the receive channels, the receiver 168 can include an LO channel configured to receive the LO signal output by the light source 152.

Figure 5:
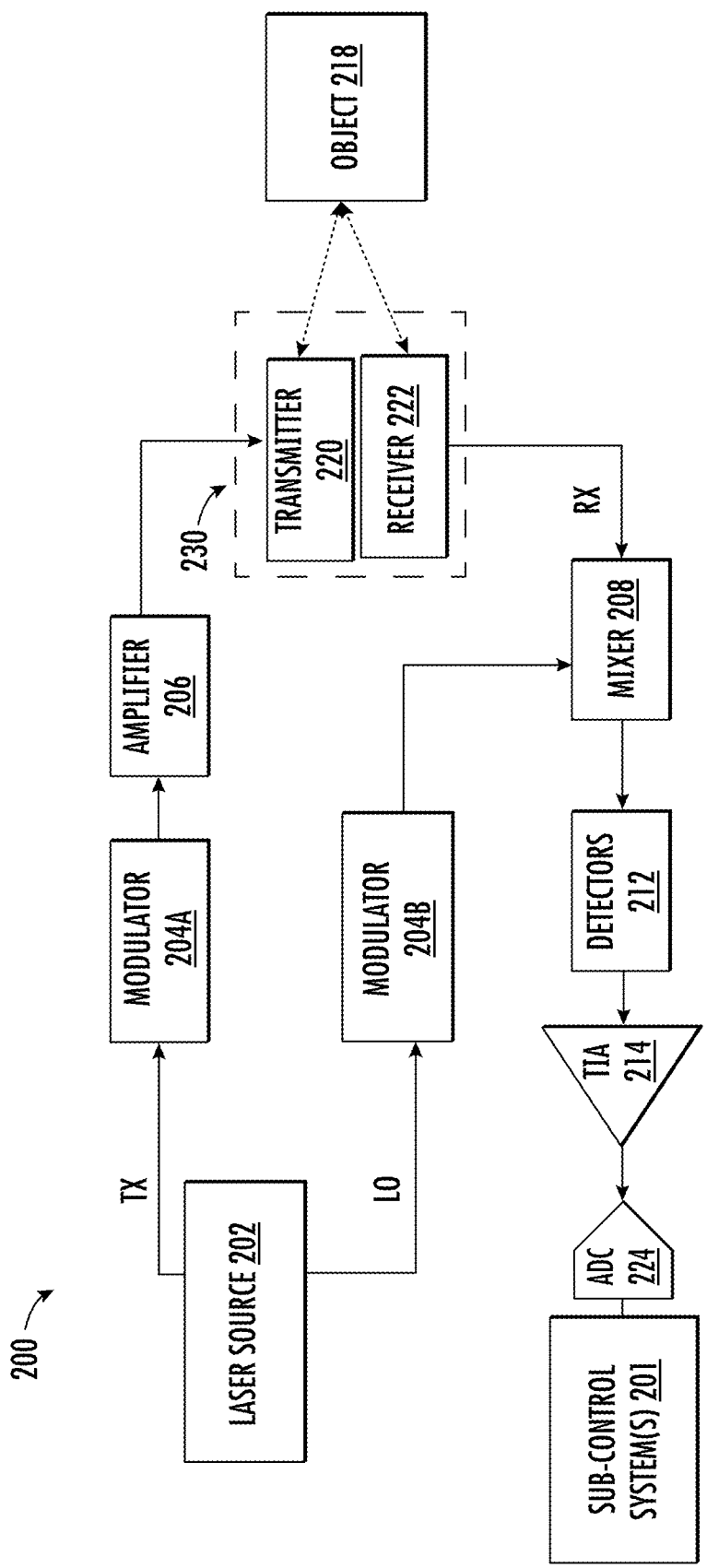
FIG. 5 depicts a block diagram of an example LIDAR sensor system according to some implementations of the present disclosure.

FIG. 5 is a block diagram illustrating an example LIDAR sensor system for autonomous vehicles, according to some implementations. The environment includes a LIDAR system 200 that includes a transmit (Tx) path and a receive (Rx) path. The Tx path includes one or more Tx input/output ports (e.g., channels), and the Rx path includes one or more Rx input/output ports (e.g., channels). In some implementations, a semiconductor substrate and/or semiconductor package may include the Tx path and/or the Rx path. In some implementations, the semiconductor substrate and/or semiconductor package may include at least one of silicon photonics circuitry, programmable logic controller (PLC), or group III-V semiconductor circuitry.

In some implementations, a first semiconductor substrate and/or a first semiconductor package may include the Tx path and a second semiconductor substrate and/or a second semiconductor package may include the Rx path. In some arrangements, the Rx input/output ports and/or the Tx input/output ports may occur (or be formed/disposed/located/placed) along one or more edges of one or more semiconductor substrates and/or semiconductor packages, such as the semiconductor optical device 100.

Figure 6:
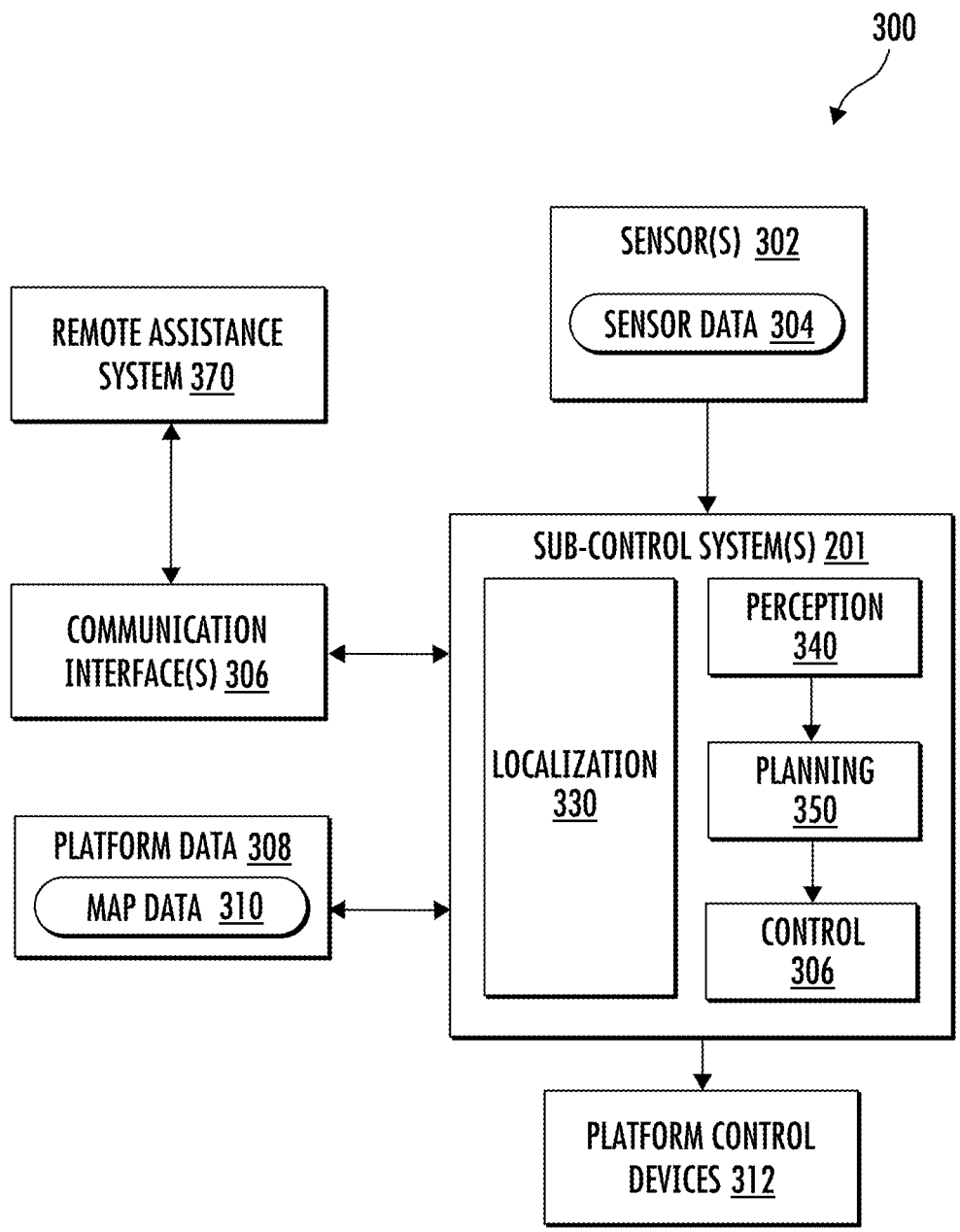
FIG. 6 depicts a block diagram of an example autonomous vehicle control system according to some implementations of the present disclosure.

The LIDAR system 200 can be coupled to one or more sub-control system(s) 201 (e.g., the sub-control system(s) 201 of FIG. 6). In some implementations, the sub-control system(s) 201 may be coupled to the Rx path via the one or more Rx input/output ports. For instance, the sub-control system(s) 201 can receive LIDAR outputs from the LIDAR system 200. The sub-control system(s) 201 can control a vehicle (e.g., an autonomous vehicle) based on the LIDAR outputs.

The Tx path may include a light source (e.g., laser source) 202, a modulator 204A, a modulator 204B, an amplifier 206, and one or more transmitters 220. The Rx path may include one or more receivers 222, a mixer 208, a detector 212, a transimpedance amplifier (TIA) 214, and one or more analog-to-digital converters (ADCs) 224. Although FIG. 2 shows only a select number of components and only one input/output channel, the LIDAR system 200 may include any number of components and/or input/output channels (in any combination) that are interconnected in any arrangement to facilitate combining multiple functions of a LIDAR system, to support the operation of a vehicle.

The light source 202 may be configured to generate a light signal (or beam) that is derived from (or associated with) a local oscillator (LO) signal. In some implementations, the light signal may have an operating wavelength that is equal to or substantially equal to 1550 nanometers. In some implementations, the light signal may have an operating wavelength that is between 1400 nanometers and 1440 nanometers.

The light source 202 may be configured to provide the light signal to the modulator 204A, which is configured to modulate a phase and/or a frequency of the light signal based on a first radio frequency (RF) signal (e.g., an "RF1" signal) to generate a modulated light signal, such as by Continuous Wave (CW) modulation or quasi-CW modulation. The modulator 204A may be configured to send the modulated light signal to the amplifier 206. The amplifier 206 may be configured to amplify the modulated light signal to generate an amplified light signal for transmission via the one or more transmitters 220. The one or more transmitters 220 may include one or more optical waveguides or antennas. In some implementations, modulator 204A and/or modulator 204B may have a bandwidth between 400 megahertz (MHz) and 1000 (MHz).

The LIDAR system 200 includes one or more transmitters 220 and one or more receivers 222. The transmitter(s) 220 and/or receiver(s) 222 can be included in a transceiver 230. The transmitter(s) 220 can provide the transmit beam that it receives from the Tx path into an environment within a given field of view toward an object 218. The one or more receivers 222 can receive a received beam reflected from the object 218 and provide the received beam to the mixer 208 of the Rx path. The one or more receivers 222 may include one or more optical waveguides or antennas. In some arrangements, the one or more transceivers 230 may include a monostatic transceiver or a bistatic transceiver.

The light source 202 may be configured to provide the LO signal to the modulator 204B, which is configured to modulate a phase and/or a frequency of the LO signal based on a second RF signal (e.g., an "RF2" signal) to generate a modulated LO signal (e.g., using Continuous Wave (CW) modulation or quasi-CW modulation) and send the modulated LO signal to the mixer 208 of the Rx path. The mixer 208 may be configured to mix (e.g., combine, multiply, etc.) the modulated LO signal with the returned signal to generate a down-converted signal and send the down-converted signal to the detector 212.

In some arrangements, the mixer 208 may be configured to send the modulated LO signal to the detector 212. The detector 212 may be configured to generate an electrical signal based on the down-converted signal and send the electrical signal to the TIA 214. In some arrangements, the detector 212 may be configured to generate an electrical signal based on the down-converted signal and the modulated signal. The TIA 214 may be configured to amplify the electrical signal and send the amplified electrical signal to the sub-control system(s) 201 via the one or more ADCs 224. In some implementations, the TIA 214 may have a peak noise-equivalent power (NEP) that is less than 5 picowatts per square root Hertz (i.e., $5 \times 10^{-12}$ Watts per square root Hertz). In some implementations, the TIA 214 may have a gain between 4 kiloohms and 25 kiloohms. In some implementations, detector 212 and/or TIA 214 may have a 3-decibel bandwidth between 80 kilohertz (kHz) and 450 megahertz (MHz).

The sub-control system(s) 201 may be configured to determine a distance to the object 218 and/or measure the velocity of the object 218 based on the one or more electrical signals that it receives from the TIA 214 via the one or more ADCs 224.

FIG. 6 depicts a block diagram of an example autonomous vehicle control system 300 for an autonomous vehicle according to some implementations of the disclosure. The autonomous vehicle control system 300 can be implemented by a computing system of an autonomous vehicle. The autonomous vehicle control system 300 can include one or more sub-control systems 201 that operate to obtain inputs from sensor(s) 302 or other input devices of the autonomous vehicle control system 300. In some implementations, the sub-control system(s) 201 can additionally obtain platform data 308 (e.g., map data 310) from local or remote storage. The sub-control system(s) 201 can generate control outputs for controlling the autonomous vehicle (e.g., through platform control devices 312, etc.) based on sensor data 304, map data 310, or other data. The sub-control system 201 may include different subsystems for performing various autonomy operations. The subsystems may include a localization system 330, a perception system 340, a planning system 350, and a control system 360. The localization system 330 can determine the location of the autonomous vehicle within its environment; the perception system 340 can detect, classify, and track objects and actors in the environment; the planning system 350 can determine a trajectory for the autonomous vehicle; and the control system 360 can translate the trajectory into vehicle controls for controlling the autonomous vehicle. The sub-control system(s) 201 can be implemented by one or more onboard computing system(s). The subsystems can include one or more processors and one or more memory devices. The one or more memory devices can store instructions executable by the one or more processors to cause the one or more processors to perform operations or functions associated with the subsystems. The computing resources of the sub-control system(s) 201 can be shared among its subsystems, or a subsystem can have a set of dedicated computing resources.

In some implementations, the autonomous vehicle control system 300 can be implemented for or by an autonomous vehicle (e.g., a ground-based autonomous vehicle). The autonomous vehicle control system 300 can perform various processing techniques on inputs (e.g., the sensor data 304, the map data 310) to perceive and understand the vehicle's surrounding environment and generate an appropriate set of control outputs to implement a vehicle motion plan (e.g., including one or more trajectories) for traversing the vehicle's surrounding environment. In some implementations, an autonomous vehicle implementing the autonomous vehicle control system 300 can drive, navigate, operate, etc. with minimal or no interaction from a human operator (e.g., driver, pilot, etc.).

In some implementations, the autonomous vehicle can be configured to operate in a plurality of operating modes. For instance, the autonomous vehicle can be configured to operate in a fully autonomous (e.g., self-driving, etc.) operating mode in which the autonomous platform is controllable without user input (e.g., can drive and navigate with no input from a human operator present in the autonomous vehicle or remote from the autonomous vehicle, etc.). The autonomous vehicle can operate in a semi-autonomous operating mode in which the autonomous vehicle can operate with some input from a human operator present in the autonomous vehicle (or a human operator that is remote from the autonomous platform). In some implementations, the autonomous vehicle can enter into a manual operating mode in which the autonomous vehicle is fully controllable by a human operator (e.g., human driver, etc.) and can be prohibited or disabled (e.g., temporary, permanently, etc.) from performing autonomous navigation (e.g., autonomous driving, etc.). The autonomous vehicle can be configured to operate in other modes such as, for example, park or sleep modes (e.g., for use between tasks such as waiting to provide a trip/service, recharging, etc.). In some implementations, the autonomous vehicle can implement vehicle operating assistance technology (e.g., collision mitigation system, power assist steering, etc.), for example, to help assist the human operator of the autonomous platform (e.g., while in a manual mode, etc.).

The autonomous vehicle control system 300 can be located onboard (e.g., on or within) an autonomous vehicle and can be configured to operate the autonomous vehicle in various environments. The environment may be a real-world environment or a simulated environment. In some implementations, one or more simulation computing devices can simulate one or more of: the sensors 302, the sensor data 304, communication interface(s) 306, the platform data 308, or the platform control devices 312 for simulating operation of the autonomous vehicle control system 300.

In some implementations, the sub-control system(s) 201 can communicate with one or more networks or other systems with communication interface(s) 306. The communication interface(s) 306 can include any suitable components for interfacing with one or more network(s), including, for example, transmitters, receivers, ports, controllers, antennas, or other suitable components that can help facilitate communication. In some implementations, the communication interface(s) 306 can include a plurality of components (e.g., antennas, transmitters, or receivers, etc.) that allow it to implement and utilize various communication techniques (e.g., multiple-input, multiple-output (MIMO) technology, etc.).

In some implementations, the sub-control system(s) 201 can use the communication interface(s) 306 to communicate with one or more computing devices that are remote from the autonomous vehicle over one or more network(s). For instance, in some examples, one or more inputs, data, or functionalities of the sub-control system(s) 201 can be supplemented or substituted by a remote system communicating over the communication interface(s) 306. For instance, in some implementations, the map data 310 can be downloaded over a network to a remote system using the communication interface(s) 306. In some examples, one or more of the localization system 330, the perception system 340, the planning system 350, or the control system 360 can be updated, influenced, nudged, communicated with, etc. by a remote system for assistance, maintenance, situational response override, management, etc.

The sensor(s) 302 can be located onboard the autonomous platform. In some implementations, the sensor(s) 302 can include one or more types of sensor(s). For instance, one or more sensors can include image capturing device(s) (e.g., visible spectrum cameras, infrared cameras, etc.). Additionally or alternatively, the sensor(s) 302 can include one or more depth capturing device(s). For example, the sensor(s) 302 can include one or more LIDAR sensor(s) or Radio Detection and Ranging (RADAR) sensor(s). The sensor(s) 302 can be configured to generate point data descriptive of at least a portion of a three-hundred-and-sixty-degree view of the surrounding environment. The point data can be point cloud data (e.g., three-dimensional LIDAR point cloud data, RADAR point cloud data). In some implementations, one or more of the sensor(s) 302 for capturing depth information can be fixed to a rotational device in order to rotate the sensor(s) 302 about an axis. The sensor(s) 302 can be rotated about the axis while capturing data in interval sector packets descriptive of different portions of a three-hundred-and-sixty-degree view of a surrounding environment of the autonomous platform. In some implementations, one or more of the sensor(s) 302 for capturing depth information can be solid state.

The sensor(s) 302 can be configured to capture the sensor data 104 indicating or otherwise being associated with at least a portion of the environment of the autonomous vehicle. The sensor data 304 can include image data (e.g., 2D camera data, video data, etc.), RADAR data, LIDAR data (e.g., 3D point cloud data, etc.), audio data, or other types of data. In some implementations, the sub-control system(s) 201 can obtain input from additional types of sensors, such as inertial measurement units (IMUs), altimeters, inclinometers, odometry devices, location or positioning devices (e.g., GPS, compass), wheel encoders, or other types of sensors. In some implementations, the sub-control system(s) 201 can obtain sensor data 304 associated with particular component(s) or system(s) of the autonomous vehicle. This sensor data 304 can indicate, for example, wheel speed, component temperatures, steering angle, cargo or passenger status, etc. In some implementations, the sub-control system(s) 201 can obtain sensor data 304 associated with ambient conditions, such as environmental or weather conditions. In some implementations, the sensor data 304 can include multi-modal sensor data. The multi-modal sensor data can be obtained by at least two different types of sensor(s) (e.g., of the sensors 302) and can indicate static and/or dynamic object(s) or actor(s) within an environment of the autonomous vehicle. The multi-modal sensor data can include at least two types of sensor data (e.g., camera and LIDAR data). In some implementations, the autonomous vehicle can utilize the sensor data 304 for sensors that are remote from (e.g., offboard) the autonomous vehicle. This can include for example, sensor data 304 captured by a different autonomous vehicle.

The sub-control system(s) 201 can obtain the map data 310 associated with an environment in which the autonomous vehicle was, is, or will be located. The map data 310 can provide information about an environment or a geographic area. For example, the map data 310 can provide information regarding the identity and location of different travel ways (e.g., roadways, etc.), travel way segments (e.g., road segments, etc.), buildings, or other items or objects (e.g., lampposts, crosswalks, curbs, etc.); the location and directions of boundaries or boundary markings (e.g., the location and direction of traffic lanes, parking lanes, turning lanes, bicycle lanes, other lanes, etc.); traffic control data (e.g., the location and instructions of signage, traffic lights, other traffic control devices, etc.); obstruction information (e.g., temporary or permanent blockages, etc.); event data (e.g., road closures/traffic rule alterations due to parades, concerts, sporting events, etc.); nominal vehicle path data (e.g., indicating an ideal vehicle path such as along the center of a certain lane, etc.); or any other map data that provides information that assists an autonomous vehicle in understanding its surrounding environment and its relationship thereto. In some implementations, the map data 310 can include high-definition map information. Additionally, or alternatively, the map data 310 can include sparse map data (e.g., lane graphs, etc.). In some implementations, the sensor data 304 can be fused with or used to update the map data 310 in real time.

The sub-control system(s) 201 can include the localization system 330, which can provide an autonomous vehicle with an understanding of its location and orientation in an environment. In some examples, the localization system 330 can support one or more other subsystems of the sub-control system(s) 201, such as by providing a unified local reference frame for performing, e.g., perception operations, planning operations, or control operations.

In some implementations, the localization system 330 can determine the current position of the autonomous vehicle. A current position can include a global position (e.g., respecting a georeferenced anchor, etc.) or relative position (e.g., respecting objects in the environment, etc.). The localization system 330 can generally include or interface with any device or circuitry for analyzing a position or change in position of an autonomous vehicle. For example, the localization system 330 can determine position by using one or more of: inertial sensors (e.g., inertial measurement unit(s), etc.), a satellite positioning system, radio receivers, networking devices (e.g., based on IP address, etc.), triangulation or proximity to network access points or other network components (e.g., cellular towers, Wi-Fi access points, etc.), or other suitable techniques. The position of the autonomous vehicle can be used by various subsystems of the sub-control system(s) 201 or provided to a remote computing system (e.g., using the communication interface(s) 306).

In some implementations, the localization system 330 can register relative positions of elements of a surrounding environment of the autonomous vehicle with recorded positions in the map data 310. For instance, the localization system 330 can process the sensor data 304 (e.g., LIDAR data, RADAR data, camera data, etc.) for aligning or otherwise registering to a map of the surrounding environment (e.g., from the map data 310) to understand the autonomous vehicle's position within that environment. Accordingly, in some implementations, the autonomous vehicle can identify its position within the surrounding environment (e.g., across six axes, etc.) based on a search over the map data 310. In some implementations, given an initial location, the localization system 330 can update the autonomous vehicle's location with incremental re-alignment based on recorded or estimated deviations from the initial location. In some implementations, a position can be registered directly within the map data 310.

In some implementations, the map data 310 can include a large volume of data subdivided into geographic tiles, such that a desired region of a map stored in the map data 310 can be reconstructed from one or more tiles. For instance, a plurality of tiles selected from the map data 310 can be stitched together by the sub-control system 201 based on a position obtained by the localization system 330 (e.g., a number of files selected in the vicinity of the position).

In some implementations, the localization system 330 can determine positions (e.g., relative or absolute) of one or more attachments or accessories for an autonomous vehicle. For instance, an autonomous vehicle can be associated with a cargo platform, and the localization system 330 can provide positions of one or more points on the cargo platform. For example, a cargo platform can include a trailer or other device towed or otherwise attached to or manipulated by an autonomous vehicle, and the localization system 330 can provide for data describing the position (e.g., absolute, relative, etc.) of the autonomous vehicle as well as the cargo platform. Such information can be obtained by the other autonomy systems to help operate the autonomous vehicle.

The sub-control system(s) 201 can include the perception system 340, which can allow an autonomous platform to detect, classify, and track objects and actors in its environment. Environmental features or objects perceived within an environment can be those within the field of view of the sensor(s) 302 or predicted to be occluded from the sensor(s) 302. This can include object(s) not in motion or not predicted to move (static objects) or object(s) in motion or predicted to be in motion (dynamic objects/actors).

The perception system 340 can determine one or more states (e.g., current or past state(s), etc.) of one or more objects that are within the surrounding environment of an autonomous vehicle. For example, state(s) can describe (e.g., for a given time, time period, etc.) an estimate of an object's current or past location (also referred to as position); current or past speed/velocity; current or past acceleration; current or past heading; current or past orientation; size/footprint (e.g., as represented by a bounding shape, object highlighting, etc.); classification (e.g., pedestrian class vs. vehicle class vs. bicycle class, etc.); the uncertainties associated therewith; or other state information. In some implementations, the perception system 340 can determine the state(s) using one or more algorithms or machine-learned models configured to identify/classify objects based on inputs from the sensor(s) 302. The perception system can use different modalities of the sensor data 304 to generate a representation of the environment to be processed by the one or more algorithms or machine-learned models. In some implementations, state(s) for one or more identified or unidentified objects can be maintained and updated over time as the autonomous vehicle continues to perceive or interact with the objects (e.g., maneuver with or around, yield to, etc.). In this manner, the perception system 340 can provide an understanding about a current state of an environment (e.g., including the objects therein, etc.) informed by a record of prior states of the environment (e.g., including movement histories for the objects therein). Such information can be helpful as the autonomous vehicle plans its motion through the environment.

The sub-control system(s) 201 can include the planning system 350, which can be configured to determine how the autonomous platform is to interact with and move within its environment. The planning system 350 can determine one or more motion plans for an autonomous platform. A motion plan can include one or more trajectories (e.g., motion trajectories) that indicate a path for an autonomous vehicle to follow. A trajectory can be of a certain length or time range. The length or time range can be defined by the computational planning horizon of the planning system 350. A motion trajectory can be defined by one or more waypoints (with associated coordinates). The waypoint(s) can be future location(s) for the autonomous platform. The motion plans can be continuously generated, updated, and considered by the planning system 350.

The planning system 350 can determine a strategy for the autonomous platform. A strategy may be a set of discrete decisions (e.g., yield to actor, reverse yield to actor, merge, lane change) that the autonomous platform makes. The strategy may be selected from a plurality of potential strategies. The selected strategy may be a lowest cost strategy as determined by one or more cost functions. The cost functions may, for example, evaluate the probability of a collision with another actor or object.

The planning system 350 can determine a desired trajectory for executing a strategy. For instance, the planning system 350 can obtain one or more trajectories for executing one or more strategies. The planning system 350 can evaluate trajectories or strategies (e.g., with scores, costs, rewards, constraints, etc.) and rank them. For instance, the planning system 350 can use forecasting output(s) that indicate interactions (e.g., proximity, intersections, etc.) between trajectories for the autonomous platform and one or more objects to inform the evaluation of candidate trajectories or strategies for the autonomous platform. In some implementations, the planning system 350 can utilize static cost(s) to evaluate trajectories for the autonomous platform (e.g., "avoid lane boundaries," "minimize jerk," etc.). Additionally, or alternatively, the planning system 350 can utilize dynamic cost(s) to evaluate the trajectories or strategies for the autonomous platform based on forecasted outcomes for the current operational scenario (e.g., forecasted trajectories or strategies leading to interactions between actors, forecasted trajectories or strategies leading to interactions between actors and the autonomous platform, etc.). The planning system 350 can rank trajectories based on one or more static costs, one or more dynamic costs, or a combination thereof. The planning system 350 can select a motion plan (and a corresponding trajectory) based on a ranking of a plurality of candidate trajectories. In some implementations, the planning system 350 can select the highest ranked candidate, or a highest ranked feasible candidate.

The planning system 350 can then validate the selected trajectory against one or more constraints before the trajectory is executed by the autonomous platform.

To help with its motion planning decisions, the planning system 350 can be configured to perform a forecasting function. The planning system 350 can forecast future state(s) of the environment. This can include forecasting the future state(s) of other actors in the environment. In some implementations, the planning system 350 can forecast future state(s) based on current or past state(s) (e.g., as developed or maintained by the perception system 340). In some implementations, future state(s) can be or include forecasted trajectories (e.g., positions over time) of the objects in the environment, such as other actors. In some implementations, one or more of the future state(s) can include one or more probabilities associated therewith (e.g., marginal probabilities, conditional probabilities). For example, the one or more probabilities can include one or more probabilities conditioned on the strategy or trajectory options available to the autonomous vehicle. Additionally, or alternatively, the probabilities can include probabilities conditioned on trajectory options available to one or more other actors.

To implement selected motion plan(s), the sub-control system(s) 201 can include a control system 360 (e.g., a vehicle control system). Generally, the control system 360 can provide an interface between the sub-control system(s) 201 and the platform control devices 312 for implementing the strategies and motion plan(s) generated by the planning system 350. For instance, the control system 360 can implement the selected motion plan/trajectory to control the autonomous platform's motion through its environment by following the selected trajectory (e.g., the waypoints included therein). The control system 360 can, for example, translate a motion plan into instructions for the appropriate platform control devices 312 (e.g., acceleration control, brake control, steering control, etc.). By way of example, the control system 360 can translate a selected motion plan into instructions to adjust a steering component (e.g., a steering angle) by a certain number of degrees, apply a certain magnitude of braking force, increase/decrease speed, etc. In some implementations, the control system 360 can communicate with the platform control devices 312 through communication channels including, for example, one or more data buses (e.g., controller area network (CAN), etc.), onboard diagnostics connectors (e.g., OBD-II, etc.), or a combination of wired or wireless communication links. The platform control devices 312 can send or obtain data, messages, signals, etc. to or from the sub-control system(s) 201 (or vice versa) through the communication channel(s).

The sub-control system(s) 201 can receive, through communication interface(s) 306, assistive signal(s) from remote assistance system 370. Remote assistance system 370 can communicate with the sub-control system(s) 201 over a network. In some implementations, the sub-control system(s) 201 can initiate a communication session with the remote assistance system 370. For example, the sub-control system(s) 201 can initiate a session based on or in response to a trigger. In some implementations, the trigger may be an alert, an error signal, a map feature, a request, a location, a traffic condition, a road condition, etc.

After initiating the session, the sub-control system(s) 201 can provide context data to the remote assistance system 370. The context data may include sensor data 304 and state data of the autonomous vehicle. For example, the context data may include a live camera feed from a camera of the autonomous vehicle and the autonomous vehicle's current speed. An operator (e.g., human operator) of the remote assistance system 370 can use the context data to select assistive signals. The assistive signal(s) can provide values or adjustments for various operational parameters or characteristics for the sub-control system(s) 201. For instance, the assistive signal(s) can include way points (e.g., a path around an obstacle, lane change, etc.), velocity or acceleration profiles (e.g., speed limits, etc.), relative motion instructions (e.g., convoy formation, etc.), operational characteristics (e.g., use of auxiliary systems, reduced energy processing modes, etc.), or other signals to assist the sub-control system(s) 201.

The sub-control system(s) 201 can use the assistive signal(s) for input into one or more autonomy subsystems for performing autonomy functions. For instance, the planning system 350 can receive the assistive signal(s) as an input for generating a motion plan. For example, assistive signal(s) can include constraints for generating a motion plan. Additionally or alternatively, assistive signal(s) can include cost or reward adjustments for influencing motion planning by the planning system 350. Additionally, or alternatively, assistive signal(s) can be considered by the sub-control system(s) 201 as suggestive inputs for consideration in addition to other received data (e.g., sensor inputs, etc.).

The sub-control system(s) 201 may be platform agnostic, and the control system 360 can provide control instructions to platform control devices 312 for a variety of different platforms for autonomous movement (e.g., a plurality of different autonomous platforms fitted with autonomous control systems). This can include a variety of different types of autonomous vehicles (e.g., sedans, vans, SUVs, trucks, electric vehicles, combustion power vehicles, etc.) from a variety of different manufacturers/developers that operate in various different environments and, in some implementations, perform one or more vehicle services.

Figure 7:
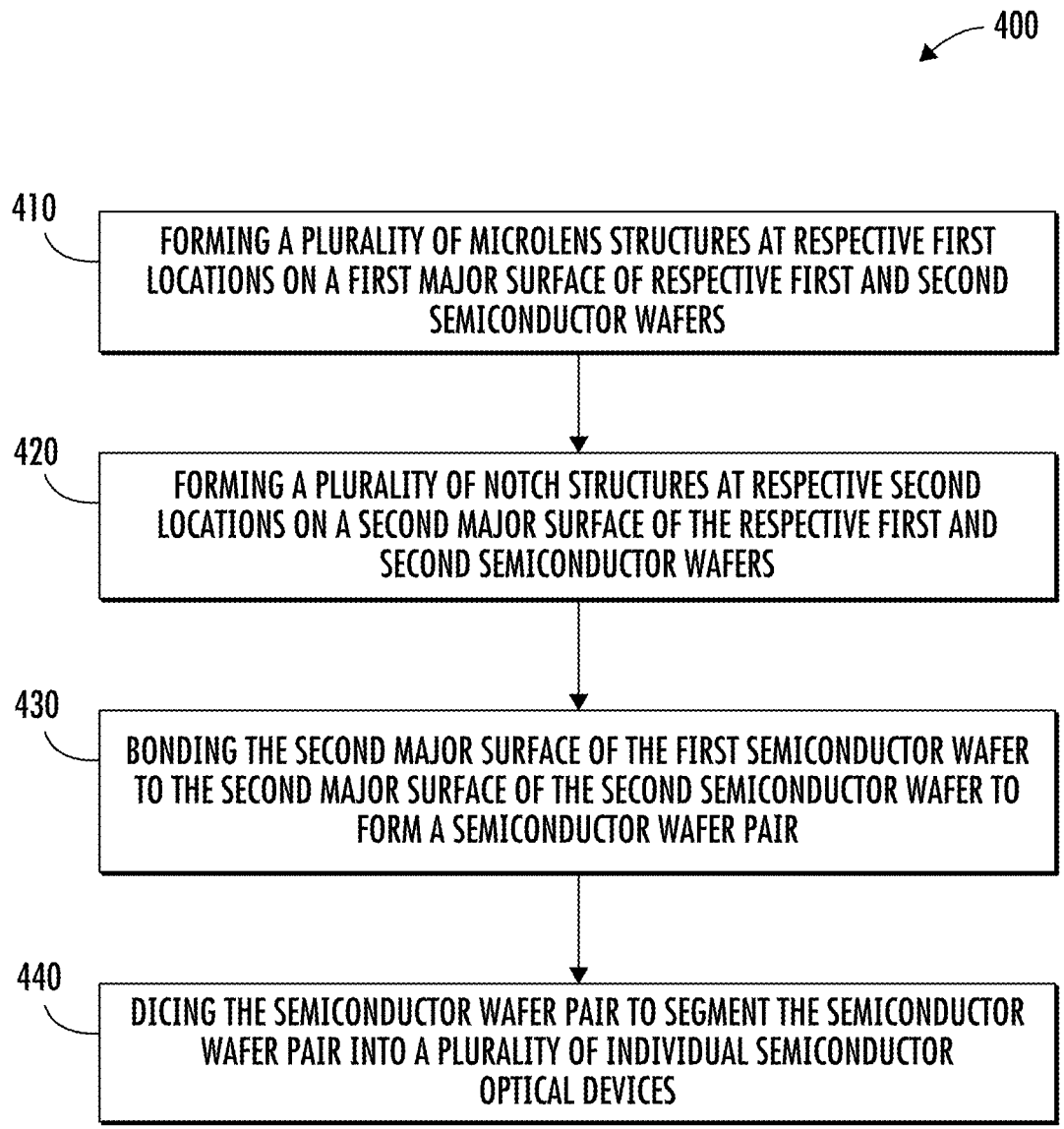
FIG. 7 depicts a flow chart of a first example method for manufacturing a semiconductor optical device according to some implementations of the present disclosure.

FIG. 7 illustrates a flow diagram of an example, non-limiting method, according to one or more example embodiments of the disclosure.

The flow diagram of FIG. 7 illustrates a method 400 for manufacturing a semiconductor optical device for a LIDAR sensor system for a vehicle, according to some implementations of the disclosure. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

Referring to FIG. 7, at operation 410, the method 400 includes forming a plurality of microlens structures at respective first locations on a first major surface of respective first and second semiconductor wafers. For example, the plurality of microlens structures formed at operation 410 can correspond to microlens structures 12 depicted in FIGS. 2C-2I. In the example of FIGS. 2H-2I, operation 410 can include forming a first plurality of microlens structures 12a on a first major surface 10a of first semiconductor wafer 30a as well as forming a second plurality of microlens structures 12b on a first major surface 10b of second semiconductor wafer 30b.

In some examples, forming a plurality of microlens structures at operation 410 includes employing a dry-etch process (e.g., reactive ion etching) to form the plurality of microlens structures at the respective first locations on the first major surface of the respective first and second semiconductor wafers. More particular exemplary operations associated with forming the plurality of microlens structures at operation 410 are depicted in FIG. 8.

Figure 8:
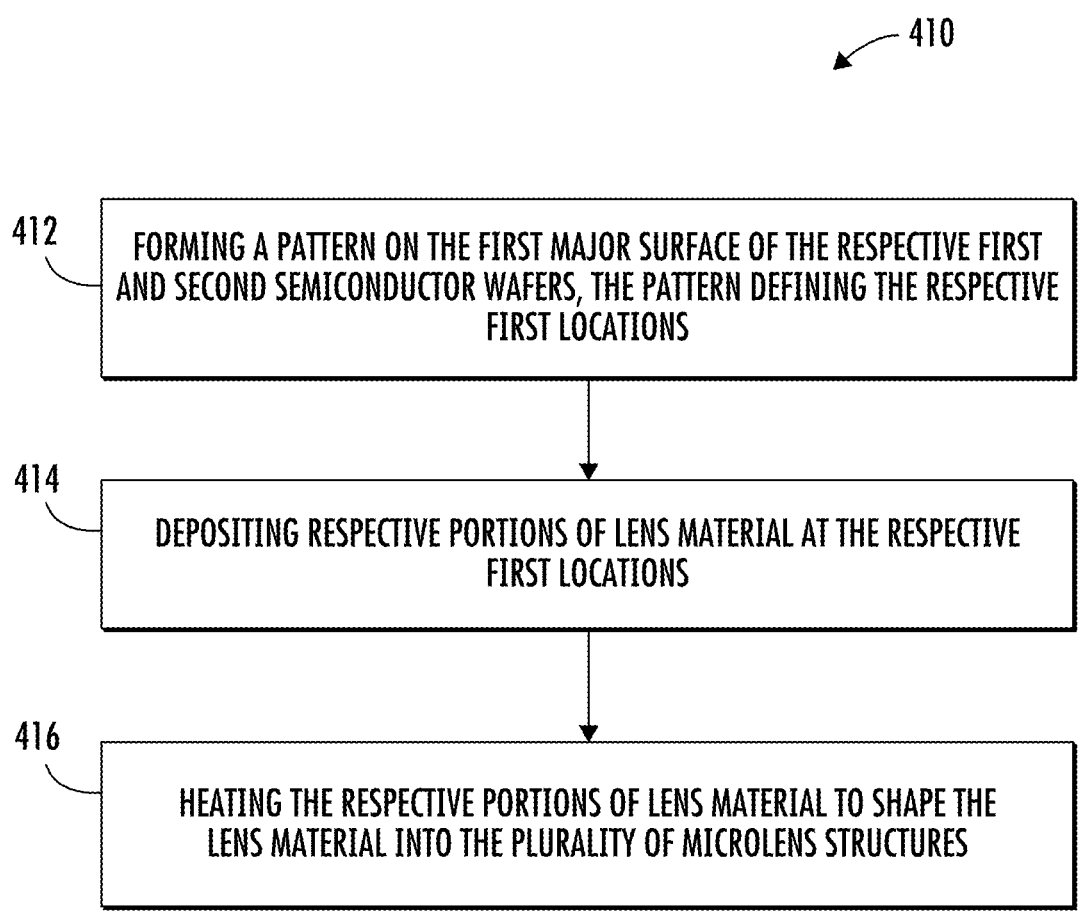
FIG. 8 depicts a flow chart of an example method for forming a plurality of microlens structures according to some implementations of the present disclosure.

The flow diagram of FIG. 8 illustrates more particular aspects of the operation 410 for forming a plurality of microlens structures on a semiconductor wafer, according to some implementations of the disclosure. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

Referring to FIG. 8, operation 412 may include forming a pattern on the first major surface of the respective first and second semiconductor wafers, the pattern defining the respective first locations. For example, the pattern formed at operation 412 may correspond to pattern 14 formed on the first major surface 10 of the respective first and second semiconductor wafers (e.g., first semiconductor wafer 30a and second semiconductor wafer 30b). The pattern 14 may define the respective first locations 13 at which the plurality of microlens structures are to be formed.

The pattern (e.g., pattern 14) formed at operation 412 may be formed to define a plurality of generally circular or rounded openings corresponding to the respective first locations 13. In some examples, a photolithography process may be employed at operation 412 to form the pattern 14 on the first major surface 10 of the respective first and second semiconductor wafers 30a and 30b. For example, a photosensitive material (e.g., a photoresist) may be applied to the first major surface 10 of the respective first and second semiconductor wafers 30a, 30b. A photomask formed to define the pattern 14 may then be placed over the photosensitive material. Light may be provided from a light source (e.g., an ultraviolet (UV) light source, deep UV light source, extreme UV light source, X-ray light source, etc.) When light is provided to the photomask, the photosensitive material is exposed in certain areas, causing the exposed areas to undergo a chemical change, making them either soluble or insoluble in a development solution. After development, the pattern 14 is transferred onto the first major surface 10 of the respective first and second semiconductor wafers 30a, 30b through one or more processes, such as etching, chemical vapor deposition, or an ion implantation process.

Referring still to FIG. 8, operation 414 may include depositing respective portions of lens material at the respective first locations. For example, the respective portions of lens material deposited at operation 414 may correspond to portions of lens material 15 deposited at the respective first locations 13 defined by the pattern 14 depicted in FIGS. 2B-2C. In some examples, lens material 15 deposited at operation 414 may include one or more of a polymer material, polypropylene, polystyrene, acrylic resin (PMMA), polycarbonate (PC), polyetherimide (PEI), cyclo-olefin polymer (COP), cyclo-olefin co-polymer (COC), methyl pentene, acrylonitrile butadiene styrene (ABS), ophthalmic material, glass material, thermoplastic material, or other suitable material. Lens material 15 may be deposited in generally cylindrical portions at the respective first locations 13 defined by the pattern 14.

Referring still to FIG. 8, operation 416 may include heating the respective portions of lens material to shape the lens material into the plurality of microlens structures. For example, heating at operation 416 can cause the lens material 15 to swell and transform into respective dome-shaped structures or hemispherical structures corresponding to the respective microlens structures 12. After this, the wafer assembly of FIG. 2B may be subjected to a reactive-ion etching (RIE) process, such as a process that exposes the wafer assembly to a chemically reactive plasma in a wafer processing chamber to remove the pattern 14. Plasma may be generated, for example, in the wafer processing chamber under low pressure by an electromagnetic field. High-energy ions from the plasma attack the first major surface 10 and react with it to remove pattern 14.

Returning again to FIG. 7, at operation 420, the method 400 includes forming a plurality of notch structures at respective second locations on a second major surface of the respective first and second semiconductor wafers. The respective second locations on the second major surface are substantially opposite the respective first locations on the first major surface. For example, the plurality of notch structures formed at operation 420 can correspond to notch structures 22 depicted in FIGS. 2E-2I. In the example of FIGS. 2H-2I, operation 420 can include forming a first plurality of notch structures 22a on a second major surface 11a of first semiconductor wafer 30a as well as forming a second plurality of notch structures 22b on a second major surface 11b of second semiconductor wafer 30b.

In some examples, forming a plurality of notch structures at operation 420 includes employing a wet-etch process (e.g., anisotropic silicon etching) to form the plurality of notch structures at the respective second locations on the second major surface of the respective first and second semiconductor wafers. More particular exemplary operations associated with forming the plurality of notch structures are depicted in FIG. 9.

Figure 9:
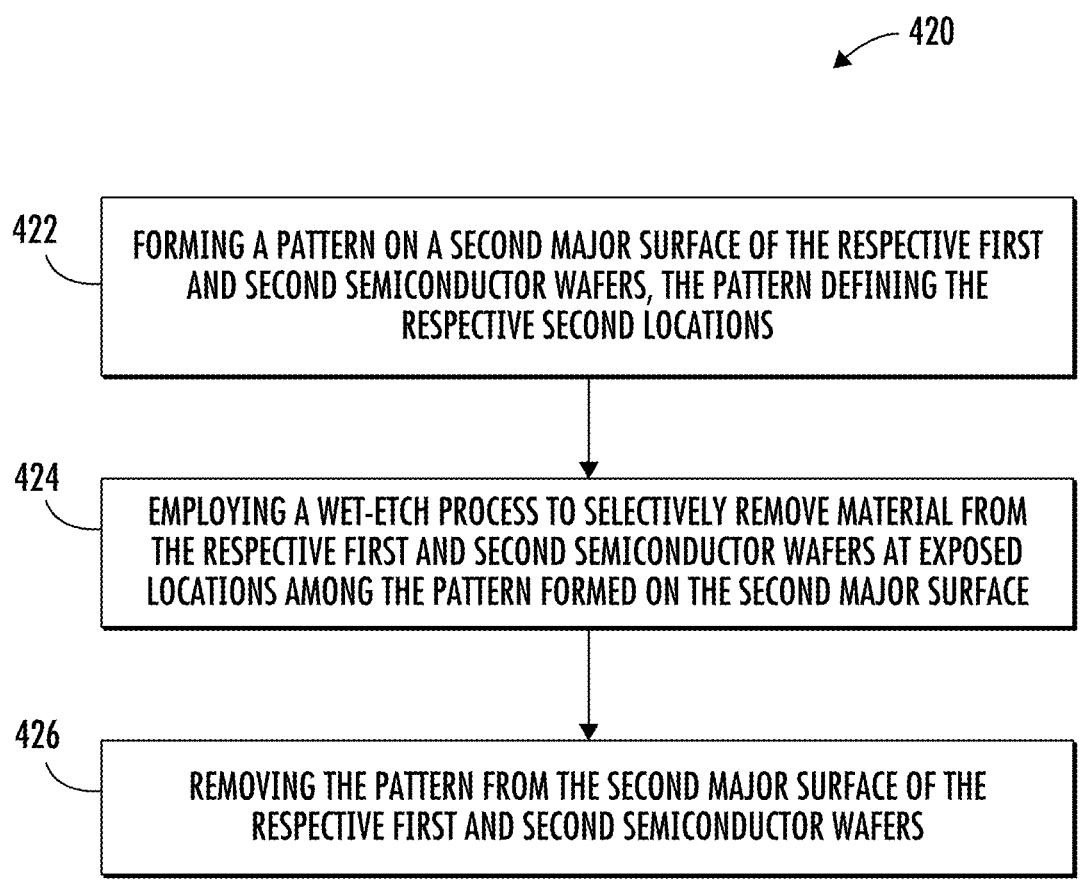
FIG. 9 depicts a flow chart of an example method for forming a plurality of notch structures according to some implementations of the present disclosure.

The flow diagram of FIG. 9 illustrates more particular aspects of the operation 420 for forming a plurality of notch structures on a semiconductor wafer, according to some implementations of the disclosure. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

Referring to FIG. 9, operation 422 may include forming a pattern on a second major surface of the respective first and second semiconductor wafers, the pattern defining the respective second locations. For example, the pattern formed at operation 422 may correspond to pattern 24 formed on the second major surface 11 of the respective first and second semiconductor wafers (e.g., first semiconductor wafer 30a and second semiconductor wafer 30b). The pattern 24 may define the respective second locations 20 at which the plurality of notch structures 22 are to be formed. In some examples, a photolithography process may be employed at operation 422 to form the pattern 24 on the second major surface 11 of the respective first and second semiconductor wafers 30a, 30b. For example, a photosensitive material (e.g., a photoresist) may be applied to the second major surface 11 of the respective first and second semiconductor wafers 30a, 30b. A photomask formed to define the pattern 24 may then be placed over the photosensitive material. Light may be provided from a light source (e.g., an ultraviolet (UV) light source, deep UV light source, extreme UV light source, X-ray light source, etc.) When light is provided to the photomask, the photosensitive material is exposed in certain areas, causing the exposed areas to undergo a chemical change, making them either soluble or insoluble in a development solution. After development, the pattern 24 is transferred onto the second major surface 11 of the respective first and second semiconductor wafers 30a, 30b through one or more processes, such as etching, chemical vapor deposition, or an ion implantation process. In some embodiments, the pattern 24 is also formed along the entirety of the first major surface 10 including the microlens structures 12 to protect them during the wet-etch process of forming notch structures 22 at operation 420.

Referring still to FIG. 9, operation 424 may involve employing a wet-etch process to selectively remove material from the respective first and semiconductor wafers at exposed locations among the pattern formed on the second major surface. For example, the respective first and second semiconductor wafers 30a, 30b including pattern 24 may be exposed to an etching solution that selectively removes material from the respective first and second semiconductor wafers 30a, 30b. The semiconductor material removal at operation 424 may be implemented in planar directions, creating well-defined features with sharp corners and edges, such as the first angled surface 26' and second angled surface 26" of notch structures 22. When semiconductor wafers 30a, 30b respectively include a silicon wafer, an anisotropic etching solution may be used such as a solution that contains one or more of: potassium hydroxide (KOH), tetramethylammonium hydroxide (TMAH), nitric acid and hydrofluoric acid (HNO3/HF), etc. An anisotropic etching solution may remove material from the (111) planes of the silicon wafer, creating features corresponding to the notch structure 22.

Operation 426 may involve removing the pattern formed at operation 422. For example, the pattern 24 may be removed from the respective first and second semiconductor wafers 30a, 30b, resulting in respective wafers as depicted in FIG. 2F.

Referring again to FIG. 7, at operation 430, method 400 may include bonding the second major surface of the first semiconductor wafer to the second major surface of the second semiconductor wafer to form a semiconductor wafer pair. For example, bonding at operation 430 may correspond to bonding the second major surface 11a of first semiconductor wafer 30a to second major surface 11b of second semiconductor wafer 30b as depicted in FIG. 2H to form semiconductor wafer pair 40. In some examples, bonding at operation 430 may include aligning a first notch structure of the first semiconductor wafer opposite a second notch structure of the second semiconductor wafer and adhering together portions of the second major surface forming the respective first and second semiconductor wafers. The alignment associated with bonding operation 430 may correspond to aligning the first notch structure 22a of the first semiconductor wafer 30a opposite the second notch structure 22b of the second semiconductor wafer 30b as depicted in FIG. 2H.

At operation 440, the method 400 may include dicing the semiconductor wafer pair to segment the semiconductor wafer pair into a plurality of individual semiconductor optical devices. For example, the dicing at operation 440 may correspond to dicing the semiconductor wafer pair 40 of FIG. 2H. For example, dicing at operation 440 may occur along dicing lines 43 as depicted in FIG. 2I to form a plurality of individual semiconductor optical devices 44. The plurality of individual semiconductor optical devices 44 may respectively include at least one of the plurality of microlens structures 12a and at least one of the plurality of notch structures 22a formed on the first semiconductor wafer 30a and at least one of the plurality of microlens structures 12b and at least one of the plurality of notch structures 22b formed on the second semiconductor wafer 30b. In some instances, dicing at operation 440 may include dicing the semiconductor wafer pair 40 at a vertex 27a of the first notch structure 22a and at a vertex 27b of the second notch structure 22b. The plurality of individual semiconductor optical devices formed by dicing at operation 440 may also correspond, for example, to the semiconductor optical device 100 depicted in FIGS. 3-4.

Figure 10:
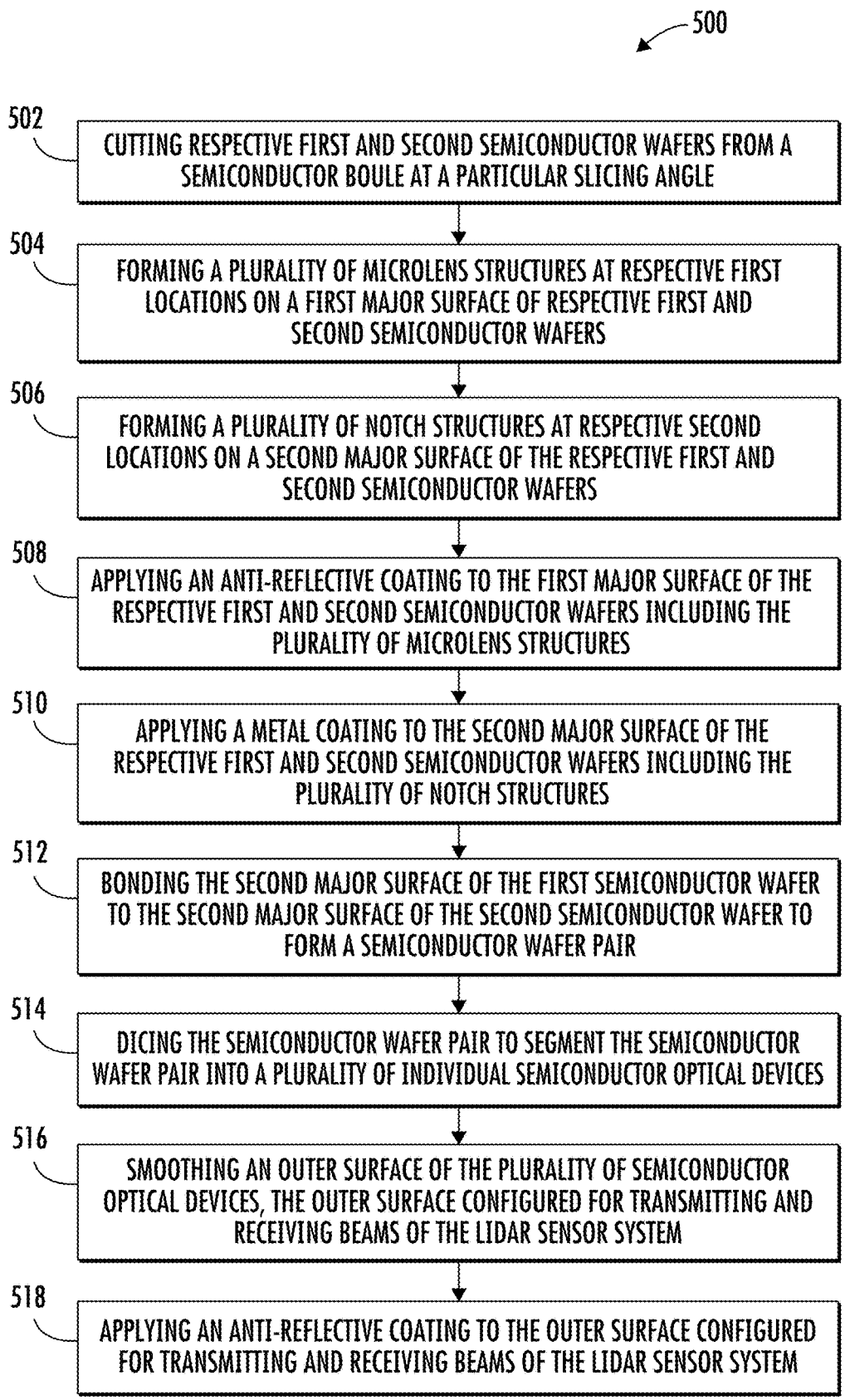
FIG. 10 depicts a flow chart of a second example method for manufacturing a semiconductor optical device according to some implementations of the present disclosure.

FIG. 10 illustrates a flow diagram of an example, non-limiting method, according to one or more example embodiments of the disclosure.

The flow diagram of FIG. 10 illustrates a method 500 for manufacturing a semiconductor optical device for a LIDAR sensor system for a vehicle, according to some implementations of the disclosure. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible. The method 500 may be an extension of the method of FIG. 7. However, in some implementations the method 500 may be a standalone method or parts of method 500 may be selectively incorporated into the method 400 of FIG. 7.

Referring to FIG. 10, at operation 502, the method 500 includes cutting respective first and second semiconductor wafers from a semiconductor boule at a particular slicing angle such that the first major surface of the respective first and second semiconductor wafers is oriented in a range from about 5 to about 15 degrees relative to the (110) plane of the crystalline structure forming the semiconductor boule. For example, operation 502 may correspond to cutting respective first and second semiconductor wafers 30a, 30b similar to semiconductor wafer 1 depicted in FIGS. 1A-1B. The respective first and second semiconductor wafers 30a, 30b may be cut at operation 502 from a semiconductor boule 2 at a particular slicing angle 5 such that the first major surface 10a, 10b of the semiconductor wafers 30a, 30b are oriented in a range from about 5 to about 15 degrees relative to the (110) plane of the crystalline structure forming semiconductor boule 2.

At operation 504, the method 500 may include forming a plurality of microlens structures at respective first locations on a first major surface of respective first and second semiconductor wafers cut at operation 502. For example, the plurality of microlens structures formed at operation 504 can correspond to microlens structures 12 depicted in FIGS. 2C-2I. In the example of FIGS. 2H-2I, operation 504 can include forming a first plurality of microlens structures 12a on a first major surface 10a of first semiconductor wafer 30a as well as forming a second plurality of microlens structures 12b on a first major surface 10b of second semiconductor wafer 30b. In some examples, forming a plurality of microlens structures at operation 504 includes employing a dry-etch process (e.g., reactive ion etching) to form the plurality of microlens structures at the respective first locations on the first major surface of the respective first and second semiconductor wafers. Additional aspects of operation 504 may be similar to operation 410 of FIGS. 7-8, and so additional description is omitted here for the sake of brevity.

At operation 506, the method 500 may include forming a plurality of notch structures at respective second locations on a second major surface of the respective first and second semiconductor wafers. The respective second locations on the second major surface are substantially opposite the respective first locations on the first major surface. For example, the plurality of notch structures formed at operation 506 can correspond to notch structures 22 depicted in FIGS. 2E-2I. In the example of FIGS. 2H-2I, operation 506 can include forming a first plurality of notch structures 22a on a first major surface 10a of first semiconductor wafer 30a as well as forming a second plurality of notch structures 22b on a second major surface 11b of second semiconductor wafer 30b. In some examples, forming a plurality of notch structures at operation 506 includes employing a wet-etch process (e.g., anisotropic silicon etching) to form the plurality of notch structures at the respective second locations on the second major surface of the respective first and second semiconductor wafers. Additional aspects of operation 506 may be similar to operation 420 of FIGS. 7 & 9, and so additional description is omitted here for the sake of brevity.

At operation 508, the method 500 may include applying an anti-reflective coating to the first major surface of the respective first and second semiconductor wafers including the plurality of microlens structures. For example, operation 508 may include applying the anti-reflective coating 31 to the first major surface 10 of the respective first and second semiconductor wafers 30 including the plurality of microlens structures 12 as depicted in FIG. 2G.

At operation 510, the method 500 may include applying a metal coating to the second major surface of the respective first and second semiconductor wafers including the plurality of notch structures. For example, operation 510 may include applying the metal coating 32 to the second major surface 11 of the respective first and second semiconductor wafers 30 including the plurality of notch structures 22 as depicted in FIG. 2G. In some embodiments, an adhesive coating (e.g., silicon oxide, silicon nitride, a dielectric coating, etc.) is first applied to the second major surface 11 underneath the metal coating 32 (e.g., aluminum, chromium, anodized chromium or black chrome, etc.) to facilitate adhesion of the metal coating 32 to the silicon or other material forming semiconductor wafer 30.

At operation 512, the method 500 may include bonding the second major surface of the first semiconductor wafer to the second major surface of the second semiconductor wafer to form a semiconductor wafer pair. For example, bonding at operation 512 may correspond to bonding the second major surface 11a of the first semiconductor wafer 30a to the second major surface 11b of the second semiconductor wafer 30b as depicted in FIG. 2H to form the semiconductor wafer pair 40. In some examples, bonding at operation 512 may include aligning a first notch structure of the first semiconductor wafer opposite a second notch structure of the second semiconductor wafer and adhering together portions of the second major surface forming the respective first and second semiconductor wafers. The alignment associated with bonding operation 512 may correspond to aligning the first notch structure 22a of the first semiconductor wafer 30a opposite the second notch structure 22b of the second semiconductor wafer 30b as depicted in FIG. 2H.

At operation 514, the method 500 may include dicing the semiconductor wafer pair to segment the semiconductor wafer pair into a plurality of individual semiconductor optical devices. For example, the dicing at operation 514 may correspond to dicing the semiconductor wafer pair 40 of FIG. 2H. For example, dicing at operation 514 may occur along dicing lines 43 as depicted in FIG. 2I to form a plurality of individual semiconductor optical devices 44. The plurality of individual semiconductor optical devices 44 may respectively include at least one of the plurality of microlens structures 12a and at least one of the plurality of notch structures 22a formed on the first semiconductor wafer 30a and at least one of the plurality of microlens structures 12b and at least one of the plurality of notch structures 22b formed on the second semiconductor wafer 30b. In some instances, dicing at operation 514 may include dicing the semiconductor wafer pair 40 at a vertex 27a of the first notch structure 22a and at a vertex 27b of the second notch structure 22b.

At operation 516, the method 500 may include smoothing an outer surface of the plurality of semiconductor optical devices formed by dicing at operation 514. In some examples, operation 516 includes smoothing the outer surface configured for transmitting and receiving beams of the LIDAR sensor system (e.g., first beam directing portion 116 and second beam directing portion 126 depicted in FIG. 3). For example, an outer surface smoothed at operation 516 may correspond to the outer surface of the individual semiconductor optical devices 44 of FIG. 2I where diced (e.g., at the dicing lines 43). Smoothing at operation 516 may be implemented by one or more smoothing procedures, such as, but not limited to, grinding, polishing, lapping, etc. Smoothing of such surfaces can help to facilitate directing beams (e.g., transmitting and/or receiving beams) in and/or out of the semiconductor optical devices 44.

At operation 518, the method 500 may include applying an anti-reflective coating to the outer surface configured for transmitting and receiving beams of the LIDAR sensor system. For example, operation 518 includes applying an anti-reflective coating similar to anti-reflective coating 31 of FIG. 2G to the outer surface configured for transmitting and receiving beams of the LIDAR sensor system (e.g., first beam directing portion 116 and second beam directing portion 126 depicted in FIG. 3). For example, an anti-reflective coating may be applied at operation 518 to the outer surface smoothed at operation 516.

The following describes the technology of this disclosure within the context of a LIDAR system and an autonomous vehicle for example purposes only. As described herein, the technology described herein is not limited to an autonomous vehicle and can be implemented for or within other systems, autonomous platforms, and other computing systems.

What is claimed is:

1. A method for manufacturing a semiconductor optical device for a LIDAR sensor system for a vehicle, the method comprising:
    (a) forming a plurality of microlens structures at respective first locations on a first major surface of respective first and second semiconductor wafers;
    (b) forming a plurality of notch structures at respective second locations on a second major surface of the respective first and second semiconductor wafers, wherein the respective second locations on the second major surface are substantially opposite the respective first locations on the first major surface;
    (c) bonding the second major surface of the first semiconductor wafer to the second major surface of the second semiconductor wafer to form a semiconductor wafer pair; and
    (d) dicing the semiconductor wafer pair to segment the semiconductor wafer pair into a plurality of individual semiconductor optical devices.

2. The method of claim 1, wherein the plurality of individual semiconductor optical devices respectively comprise at least one of the plurality of microlens structures and at least one of the plurality of notch structures formed on the first semiconductor wafer and at least one of the plurality of microlens structures and at least one of the plurality of notch structures formed on the second semiconductor wafer.

3. The method of claim 1, wherein (a) comprises employing a dry-etch process to form the plurality of microlens structures at the respective first locations on the first major surface of the respective first and second semiconductor wafers.

4. The method of claim 1, wherein (a) comprises:
    (i) forming a pattern on the first major surface of the respective first and second semiconductor wafers, the pattern defining the respective first locations;
    (ii) depositing respective portions of lens material at the respective first locations; and
    (iii) heating the respective portions of lens material to shape the lens material into the plurality of microlens structures.

5. The method of claim 4, wherein (i) comprises employing a photolithography process to form the pattern on the first major surface of the respective first and second semiconductor wafers.

6. The method of claim 1, wherein (b) comprises employing a wet-etch process to form the plurality of notch structures at the respective second locations on the second major surface of the respective first and second semiconductor wafers.

7. The method of claim 1, wherein (b) comprises employing a wet-etch process to form the plurality of notch structures to respectively have a first angled surface and a second angled surface, wherein the first angled surface and the second angled surface are formed to have angles relative to the second major surface in a range of between about 20 degrees and about 70 degrees.

8. The method of claim 1, further comprising:
    (e) applying an anti-reflective coating to the first major surface of the respective first and second semiconductor wafers including the plurality of microlens structures.

9. The method of claim 1, further comprising:
    (f) applying a metal coating to the second major surface of the respective first and second semiconductor wafers including the plurality of notch structures.

10. The method of claim 1, wherein (c) comprises:
    (i) aligning a first notch structure of the first semiconductor wafer opposite a second notch structure of the second semiconductor wafer; and
    (ii) adhering together portions of the second major surface forming the respective first and second semiconductor wafers.

11. The method of claim 10, wherein (d) comprises: dicing the semiconductor wafer pair at a vertex of the first notch structure and at a vertex of the second notch structure.

12. The method of claim 1, further comprising: (g) smoothing an outer surface of the plurality of semiconductor optical devices, the outer surface configured for transmitting and receiving beams of the LIDAR sensor system.

13. The method of claim 12, further comprising: (h) applying an anti-reflective coating to the outer surface configured for transmitting and receiving beams of the LIDAR sensor system.

14. The method of claim 1, further comprising: (i) cutting the respective first and second semiconductor wafers from a semiconductor boule at a particular slicing angle such that the first major surface of the respective first and second semiconductor wafers is oriented in a range from about 5 to about 15 degrees relative to a (110) plane of a crystalline structure forming the semiconductor boule.

15. A method for manufacturing a semiconductor optical device for a LIDAR sensor system for a vehicle, the method comprising:
    (a) employing a dry-etch process to form a plurality of microlens structures at respective first locations on a first major surface of respective first and second semiconductor wafers;
    (b) employing a wet-etch process to form a plurality of notch structures at respective second locations on a second major surface of the respective first and second semiconductor wafers, wherein the respective second locations on the second major surface are substantially opposite the respective first locations on the first major surface;

(c) bonding the second major surface of the first semiconductor wafer to the second major surface of the second semiconductor wafer to form a semiconductor wafer pair; and
(d) dicing the semiconductor wafer pair to segment the semiconductor wafer pair into a plurality of individual semiconductor optical devices.

16. The method of claim 15, further comprising:
(e) applying an anti-reflective coating to the first major surface of the respective first and second semiconductor wafers including the plurality of microlens structures.

17. The method of claim 16, further comprising:
(f) applying a metal coating to the second major surface of the respective first and second semiconductor wafers including the plurality of notch structures.

18. The method of claim 17, wherein (d) comprises:
(g) dicing the semiconductor wafer pair at a vertex of a first notch structure of the plurality of notch structures formed on the first semiconductor wafer and at a vertex of a second notch structure of the plurality of notch structures formed on the second semiconductor wafer.

19. The method of claim 18, further comprising:
(h) smoothing an outer surface of the plurality of semiconductor optical devices, the outer surface configured for transmitting and receiving beams of the LIDAR sensor system.

20. The method of claim 19, further comprising:
(i) applying an anti-reflective coating to the outer surface configured for transmitting and receiving beams of the LIDAR sensor system.

* * * * *